(12) United States Patent
Palm et al.

(10) Patent No.: US 11,569,186 B2
(45) Date of Patent: Jan. 31, 2023

(54) DEVICE INCLUDING SEMICONDUCTOR CHIPS AND METHOD FOR PRODUCING SUCH DEVICE

(71) Applicant: Infineon Technologies AG, Neubiberg (DE)

(72) Inventors: Petteri Palm, Regensburg (DE); Thorsten Scharf, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 101 days.

(21) Appl. No.: 17/158,226

(22) Filed: Jan. 26, 2021

(65) Prior Publication Data

US 2021/0151401 A1 May 20, 2021

Related U.S. Application Data

(63) Continuation of application No. 15/949,632, filed on Apr. 10, 2018, now Pat. No. 10,903,180, which is a
(Continued)

(51) Int. Cl.
*H01L 23/00* (2006.01)
*H01L 23/538* (2006.01)
(Continued)

(52) U.S. Cl.
CPC .......... *H01L 24/06* (2013.01); *H01L 23/5389* (2013.01); *H01L 24/19* (2013.01);
(Continued)

(58) Field of Classification Search
CPC ..... H01L 24/06; H01L 23/5389; H01L 24/19; H01L 24/20; H01L 24/83; H01L 25/04; H01L 2224/04105; H01L 2224/06181; H01L 2224/06182; H01L 2224/12105; H01L 2224/2518; H01L 2224/73267; H01L 2224/8019; H01L 2224/83132;
(Continued)

(56) References Cited

U.S. PATENT DOCUMENTS 5,856,913 A 1/1999 Heilbronner
6,495,924 B2 12/2002 Kodama et al.
(Continued)

OTHER PUBLICATIONS

Non-Final Office Action dated Feb. 4, 2019 in U.S. Appl. No. 15/949,632.
(Continued)

*Primary Examiner* — Jonathan Han
(74) *Attorney, Agent, or Firm* — Dicke, Billig & Czaja, PLLC

(57) ABSTRACT

A device includes a first semiconductor chip including a first face, wherein a first contact pad is arranged over the first face. The device further includes a second semiconductor chip including a first face, wherein a first contact pad is arranged over the first face, wherein the first semiconductor chip and the second semiconductor chip are arranged such that the first face of the first semiconductor chip faces in a first direction and the first face of the second semiconductor chip faces in a second direction opposite to the first direction. The first semiconductor chip is located laterally outside of an outline of the second semiconductor chip.

22 Claims, 25 Drawing Sheets

Related U.S. Application Data continuation of application No. 14/069,361, filed on Oct. 31, 2013, now Pat. No. 9,941,229.

(51) Int. Cl.
  *H05K 3/00* (2006.01)
  *H05K 1/18* (2006.01)
  *H01L 25/04* (2014.01)

(52) U.S. Cl.
  CPC .............. *H01L 24/20* (2013.01); *H01L 24/83* (2013.01); *H01L 25/04* (2013.01); *H05K 1/188* (2013.01); *H05K 3/007* (2013.01); *H01L 2224/04105* (2013.01); *H01L 2224/06181* (2013.01); *H01L 2224/06182* (2013.01); *H01L 2224/12105* (2013.01); *H01L 2224/2518* (2013.01); *H01L 2224/73267* (2013.01); *H01L 2224/8019* (2013.01); *H01L 2224/83132* (2013.01); *H01L 2224/83192* (2013.01); *H01L 2224/83447* (2013.01); *H01L 2924/00* (2013.01); *H01L 2924/12042* (2013.01); *H01L 2924/13055* (2013.01); *H01L 2924/13091* (2013.01); *H01L 2924/15747* (2013.01); *H05K 2203/0152* (2013.01)

(58) Field of Classification Search
  CPC . H01L 2224/83192; H01L 2224/83447; H01L 2924/00; H01L 2924/12042; H01L 2924/13055; H01L 2924/13091; H01L 2924/15747; H01L 2224/0603; H01L 21/4857; H01L 21/486; H01L 25/50; H05K 1/188; H05K 3/007; H05K 2203/0152
  See application file for complete search history.

(56) References Cited

U.S. PATENT DOCUMENTS

| | | | |
|---|---|---|---|
| 7,091,593 B2 | 8/2006 | Ishimaru | |
| 7,321,164 B2 | 1/2008 | Hsu | |
| 7,807,512 B2 * | 10/2010 | Lee | H01L 24/97 438/456 |
| 7,834,464 B2 * | 11/2010 | Meyer | H01L 21/565 257/777 |
| 8,737,080 B2 * | 5/2014 | Zhang | H05K 1/182 361/810 |
| 8,975,711 B2 | 3/2015 | Otremba et al. | |
| 8,975,726 B2 | 3/2015 | Chen | |
| 9,281,260 B2 | 3/2016 | Standing et al. | |
| 9,406,658 B2 | 8/2016 | Lee et al. | |
| 2006/0278967 A1 | 12/2006 | Tuominen et al. | |
| 2007/0035015 A1 | 2/2007 | Hsu | |
| 2008/0136002 A1 | 6/2008 | Yang | |
| 2008/0150096 A1 * | 6/2008 | Ishio | H01L 25/0655 257/659 |
| 2008/0261338 A1 | 10/2008 | Ihola et al. | |
| 2009/0260866 A1 | 10/2009 | Palm et al. | |
| 2012/0020044 A1 | 1/2012 | Ihola et al. | |
| 2012/0038034 A1 * | 2/2012 | Shin | H01L 23/5389 257/676 |
| 2012/0056312 A1 * | 3/2012 | Pagaila | H01L 25/0652 257/E23.116 |
| 2012/0187565 A1 * | 7/2012 | Ewe | H01L 24/82 257/774 |

OTHER PUBLICATIONS

Final Office Action dated Jun. 26, 2019 in U.S. Appl. No. 15/949,632.
Non-Final Office Action dated Oct. 11, 2019 in U.S. Appl. No. 15/949,632.
Final Office Action dated Mar. 17, 2020 in U.S. Appl. No. 15/949,632.
Non-Final Office Action dated Jul. 2, 2020 in U.S. Appl. No. 15/949,632.
Notice of Allowance dated Sep. 23, 2020 in U.S. Appl. No. 15/949,632.
Non-Final Office Action dated Jun. 15, 2016 in U.S. Appl. No. 14/069,361.
Final Office Action dated Nov. 21, 2016 in U.S. Appl. No. 14/069,361.
Non-Final Office Action dated Jun. 7, 2017 in U.S. Appl. No. 14/069,361.
Notice of Allowance dated Dec. 1, 2017 in U.S. Appl. No. 14/069,361.

* cited by examiner

DEVICE INCLUDING SEMICONDUCTOR CHIPS AND METHOD FOR PRODUCING SUCH DEVICE

CROSS-REFERENCE TO RELATED APPLICATION

This Utility Patent Application is a continuation application of U.S. Ser. No. 15/949,632 filed Apr. 10, 2018, which is a continuation application of U.S. Ser. No. 14/069,361 filed Oct. 31, 2013, now U.S. Pat. No. 9,941,229, both of which are incorporated herein by reference.

TECHNICAL FIELD

The disclosure relates to devices including semiconductor chips and methods for producing such devices.

BACKGROUND

Microelectronic devices may include multiple semiconductor chips that may be of different size and form. The trend to higher integrated and more compact designs of microelectronic devices may require chip integration technologies providing a desired large scale integration.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description. The elements of the drawings are not necessarily to scale relative to each other. Like reference numerals may designate corresponding similar parts.

DETAILED DESCRIPTION

Figure 1:
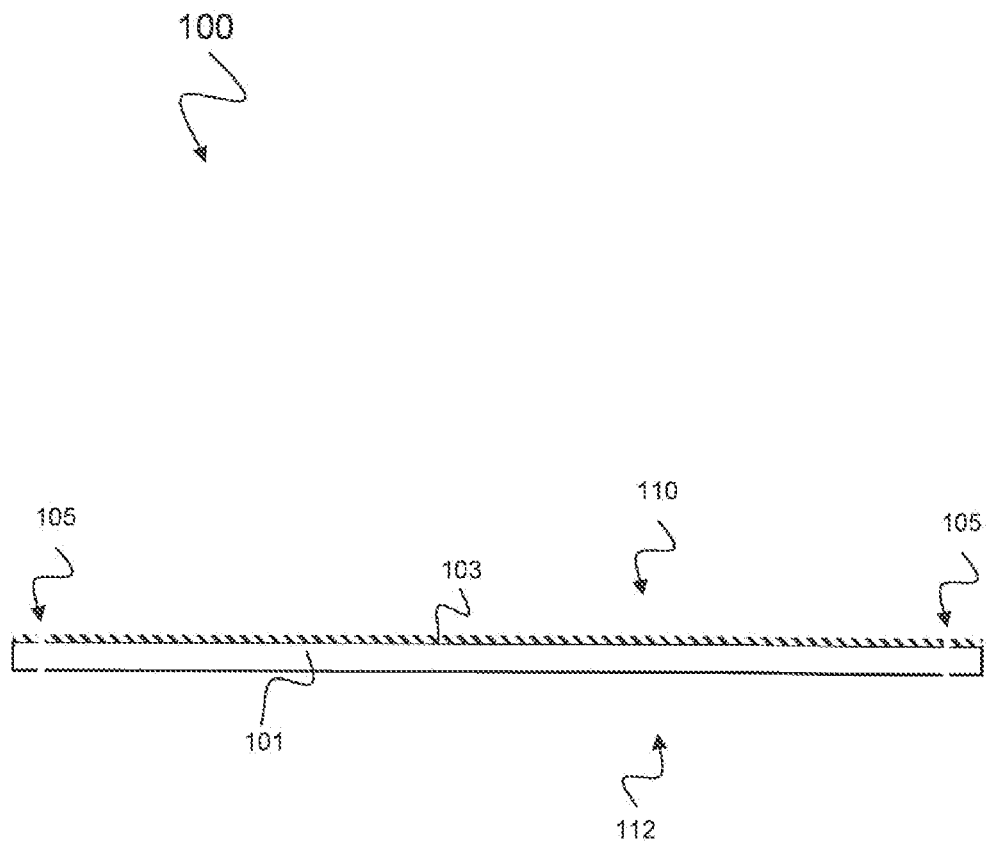
FIGS. 1 to 9 schematically illustrate a cross-sectional view of a method for providing a core layer package embedding a die IC1 where a back side contact pad of the die IC1 is manufactured with a plated back side connection.

In the following detailed description, reference is made to the accompanying drawings, which form a part hereof, and in which is shown by way of illustration specific examples in which the disclosure may be practiced. In this regard, directional terminology, such as "top," "bottom," "front," "back," "leading," "trailing," etc., may be used with reference to the orientation of the figures being described. Because components of examples can be positioned in a number of different orientations, the directional terminology may be used for purposes of illustration and is in no way limiting. It is to be understood that other examples may be utilized and structural or logical changes may be made without departing from the concept of the present disclosure. The following detailed description, therefore, is not to be taken in a limiting sense.

The features of the various examples described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Dies as described in the following may be small blocks of semiconductor material, on which a given functional circuit may be fabricated. Integrated circuits may be produced in large batches on a single wafer of electronic-grade silicon or other semiconductor material through processes such as photolithography. The wafer may be cut into many pieces, wherein each of these pieces may be referred to as a "die". Afterwards, one or more of the separated dies may be packaged. Packaging may involve attaching the die to a substrate, providing electrical connections to the die and providing a package at least partly encapsulating the die.

Devices containing multiple semiconductor chips, i.e. dies including a given functional circuit, are described in the following. It is noted that the terms "die", "semiconductor die", "chip" and "semiconductor chip" may be used synonymously in this specification. In particular, a die or semiconductor chip may include a power semiconductor. A power semiconductor chip is a specific type of semiconductor chip that may be designed to handle significant power levels. Power semiconductor chips may be particularly configured to switch and control currents and/or voltages. They may be implemented as power MOSFETs, IGBTs, JFETs, power bipolar transistors and diodes. Power semiconductor chips can be found in most power supplies, DC to DC converters and motor controllers, for example. Power semiconductor chips may be stacked on top of each other for specific applications, such as e.g. half-bridge circuits.

The semiconductor chips described herein may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have electrodes on its two main faces, that is to say on its top side and bottom side. In particular, power semiconductor chips may have a vertical structure and may have load electrodes on both main faces. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or diodes. By way of example, the source electrode and gate electrode of a power MOSFET may be situated on one face, while the drain electrode of the power MOSFET may be arranged on the other face. In addition, the devices described herein may include integrated circuits configured to control the integrated circuits of the power semiconductor chips.

The semiconductor chips may have contact pads (or contact elements or terminals) which may allow an electrical contact to be made with the integrated circuits included in the semiconductor chips. The contact pads may include one or more metal layers that may be applied to the semiconductor material. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

One or more metal layers having the shape of conductor lines (or conductor tracks) may be provided and may be electrically coupled to the semiconductor chip. The metal layers may, for example, be used to produce a redistribution layer. The conductor lines may be employed as wiring layers to make electrical contact with the semiconductor chips from outside the device and/or to make electrical contact with other semiconductor chips and/or components contained in the device. The conductor lines may couple the contact pads of the semiconductor chips to the external contact pads. The conductor lines may be manufactured with any desired geometric shape and any desired material composition. Any desired metal, for example aluminum, nickel, palladium, silver, tin, gold or copper, or metal alloys may be used as the material. The conductor lines need not be homogenous or manufactured from just one material, that is to say various compositions and concentrations of the materials contained in the conductor lines are possible. Furthermore, the conductor lines may be arranged above or below or between electrically insulating layers.

The devices described below may include external contact pads (or external contact elements), which may be of any shape and size. The external contact pads may be accessible from outside the devices and may thus allow electrical contact to be made with the semiconductor chips from outside the devices. The external contact pads may be composed of any desired electrically conductive material, for example of a metal, such as copper, aluminum or gold, a metal alloy or an electrically conductive organic material. The external contact pads may be formed by portions of the metal layers. Solder material, such as solder balls or solder bumps, may be deposited on the external contact pads.

The semiconductor chips or at least parts of the semiconductor chips may be covered with an encapsulation material, which may be electrically insulating and which may form an encapsulation body. For example, the encapsulation material may include at least one of a prepreg, a resin and a laminate.

The devices described herein may include at least one mounting surface. The mounting surface may serve to mount the device onto another component, for example, a circuit board, such as a PCB (printed circuit board). External contact elements and, in particular, external contact surfaces may be disposed on the mounting surface to allow to electrically couple the device to the component on which the device is mounted. Solder deposits, such as solder balls, or other appropriate connection elements may be used to establish an electrical and, in particular, mechanical connection between the device and the component on which the device is mounted.

The method described below with respect to FIGS. 1 to 19 may be referred to as "embedding process".

FIGS. 1 to 9 schematically illustrate a cross-sectional view of a method for providing a core layer package embedding a first die IC1 (also called thin die) where a back side contact pad of the first die may be manufactured with a plated back side connection.

FIG. 1 schematically illustrates an exemplary act of drilling 100. For example, aligning marks 105 may be laser drilled to a foil, e.g. a copper (Cu) foil 103 on which dies will be mounted later on. The foil 103 may be referred to as the bottom foil where the reference sign 112 may denote the bottom of the arrangement and the reference sign 110 may denote the top of the arrangement. Aligning marks and jig holes 105 for solder printing, component assembly, lithography may be drilled to the foil 103, for example by using a laser, e.g. a UV laser. The aligning accuracy of the aligning marks and jig holes 105 may be precise and there may be no additional tolerances that may be caused in case of the different process steps.

The base material may be a thin foil 103, e.g. a Cu foil on a thicker carrier 101, e.g. a Cu or Al or steel carrier wherein the panel may be of size 400 mm×300 mm. Other sizes may also be used, for example 600 mm×525 mm approximately corresponding to 24 inches×21 inches, 600 mm×500 mm approximately corresponding to 24 inches×20 inches or 300 mm×200 mm, 500 mm×400 mm, 500 mm×200 mm, 200 mm×200 mm, 300 mm×300 mm, 400 mm×400 mm, or 500 mm×500 mm. The functional (thin) foil 103 may have a thickness from about 3 μm (micrometer) to about 12 μm (micrometer) and may be used later on as a seed layer in a plating process as described below with respect to FIGS. 8 and 18. In other examples, the functional foil 103 may have a thickness ranging from a minimum thickness of one of 1, 2 and 3 μm (micrometer) to a maximum thickness of one of 9, 12, 15, 17, 18, 35, 70 and 105 μm (micrometer). In other examples, the functional foil 103 may have a thickness of about 2 to 11 μm (micrometer), 1 to 10 μm (micrometer), 3 to 15 μm (micrometer), 2 to 20 μm (micrometer), 1 to 30 μm (micrometer), 1 to 9 μm (micrometer), 1 to 8 μm (micrometer), 1 to 7 μm (micrometer), 1 to 6 μm (micrometer), 0.5 to 5 μm (micrometer), 0.25 to 4 μm (micrometer) or other values. The thin foil 103 may be glued on the thicker carrier 101. The thin foil 103 may also be coated with insulating/primer layer. The thicker carrier 101 may be a removable carrier. In one example, the thin foil 103 may be used without a carrier.

In other examples the foil 103 may be a metal foil, e.g. a copper (Cu) foil, an aluminum (Al) foil, a silver (Ag) foil, a nickel (Ni) foil, a palladium (Pd) foil, a Gold (Au) foil or a multilayer foil comprising a combination of such metals, e.g. one of the following: Ni, Pd and Au; Ni and Pd; Ni and Au; Ni, Pd, Ag and Au; Cu, Pd and Ni. The carrier 101 may be a Cu or Al foil having a thickness from about 35 to about 70 μm (micrometer) on the top surface of which the functional foil 103 may be electroplated. In yet other examples the Cu or Al foil may have an exemplary thickness of about 35 to 60 μm (micrometer), 35 to 80 μm (micrometer), 25 to 70 µm (micrometer), 45 to 70 µm (micrometer), 45 to 60 µm (micrometer), 25 to 80 µm (micrometer), 10 to 100 µm (micrometer), 5 to 200 µm (micrometer), 35 to 200 µm (micrometer), 5 to 300 µm (micrometer), 5 to 400 µm (micrometer) or other values. In one example, a thin plated (e.g. chromium) release layer (not shown in FIG. 1) may be arranged between the functional foil 103 and the carrier foil 101. Such a release layer may be used for removing the carrier easily by pealing after the later process steps. The foil 103 and the optional carrier 101 may form the bottom side of a layup as described below with respect to FIG. 3.

Figure 2A:
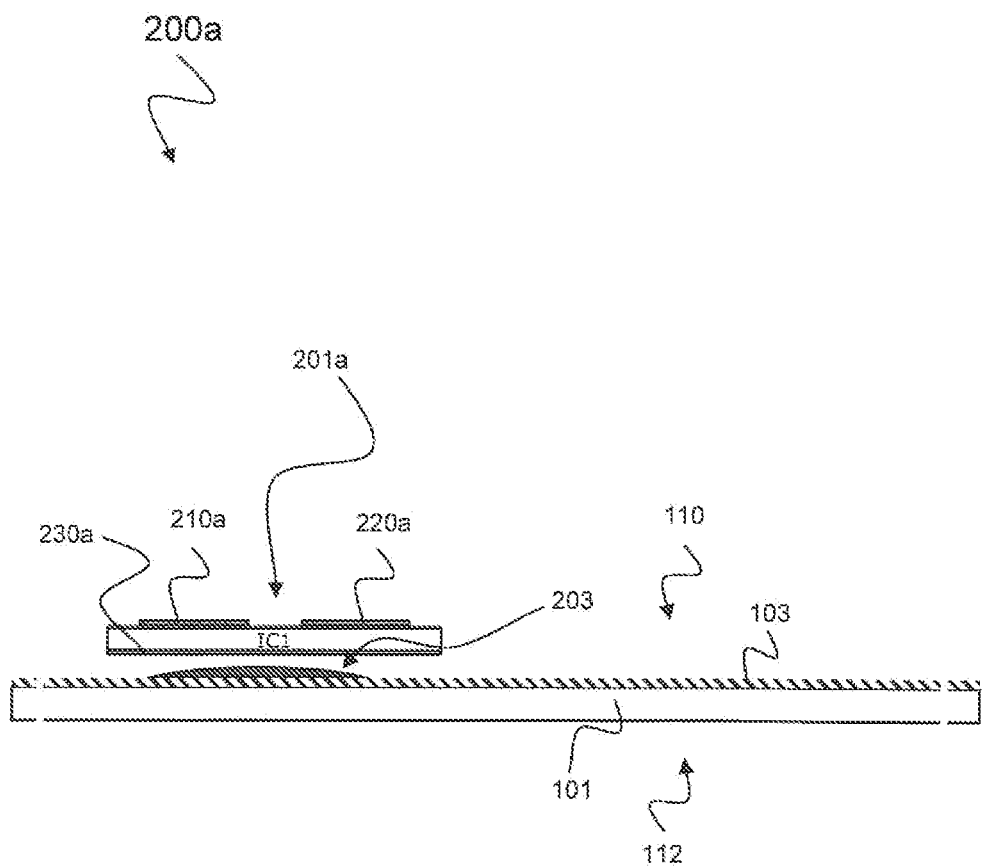
Figure 2B:
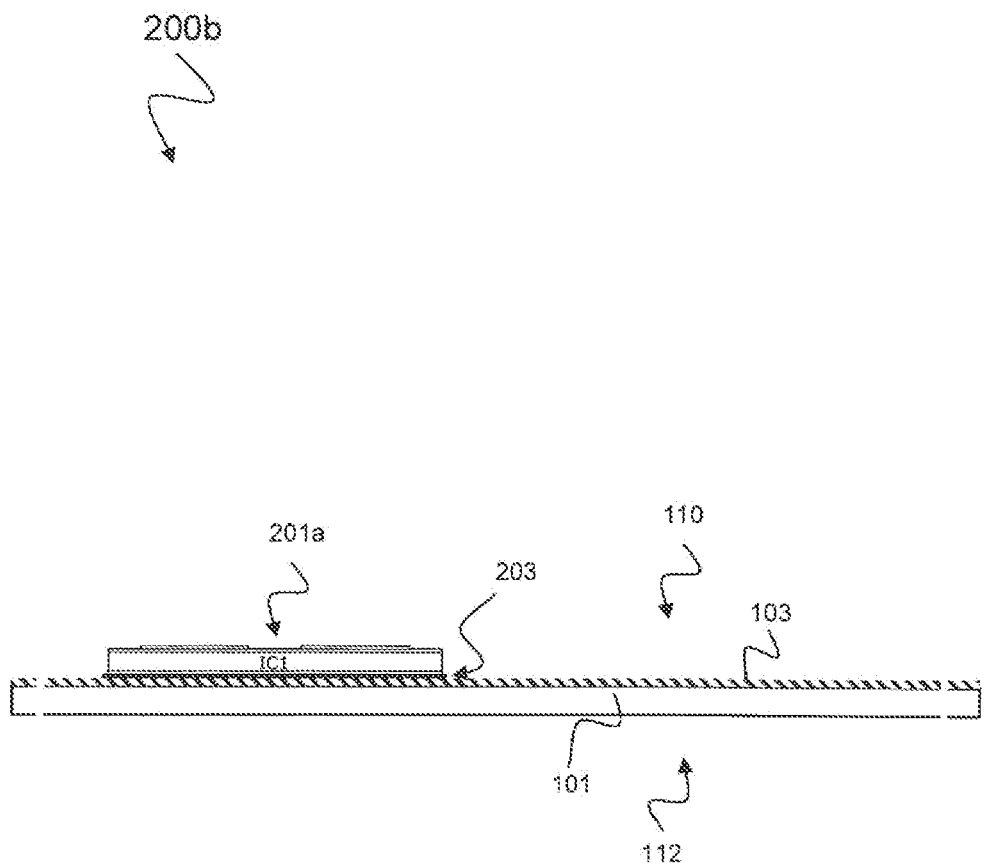

FIG. 2a and FIG. 2b schematically illustrate an exemplary act of component mounting 200a, 200b, wherein a first die (denoted as thin die) IC1 201a may be mounted on the foil 103 forming the bottom side 112 of a layup as described below with respect to FIG. 3. For the mounting act 200a, a high speed surface mount machine and non-conducting adhesive 203 may be used. A glue 203 may be printed on the surface 103, for example by using standard paste printed and metal stencils. In one example, the glue 203 may also be dispensed on the surface 103. The first die IC1 201a may be mounted on top of the adhesive 203 by using a high speed and accurate pick and placement machine. The adhesive 203 may be cured by using a reflow or batch oven. In one example, the adhesive 203 may be pre-applied on the wafer back side, e.g. by using a DAF (Die Attach Film). The purpose of the adhesive 203 may be to fix the first die 201a to the correct location. After that, the exact location of the first die 201a can be measured and this data may e.g. be transferred to maskless exposure tool or laser drilling imaging files. In one example, further dies (not shown in the Figures) may be mounted next to the first die 201a on the foil 103.

Figure 2C:
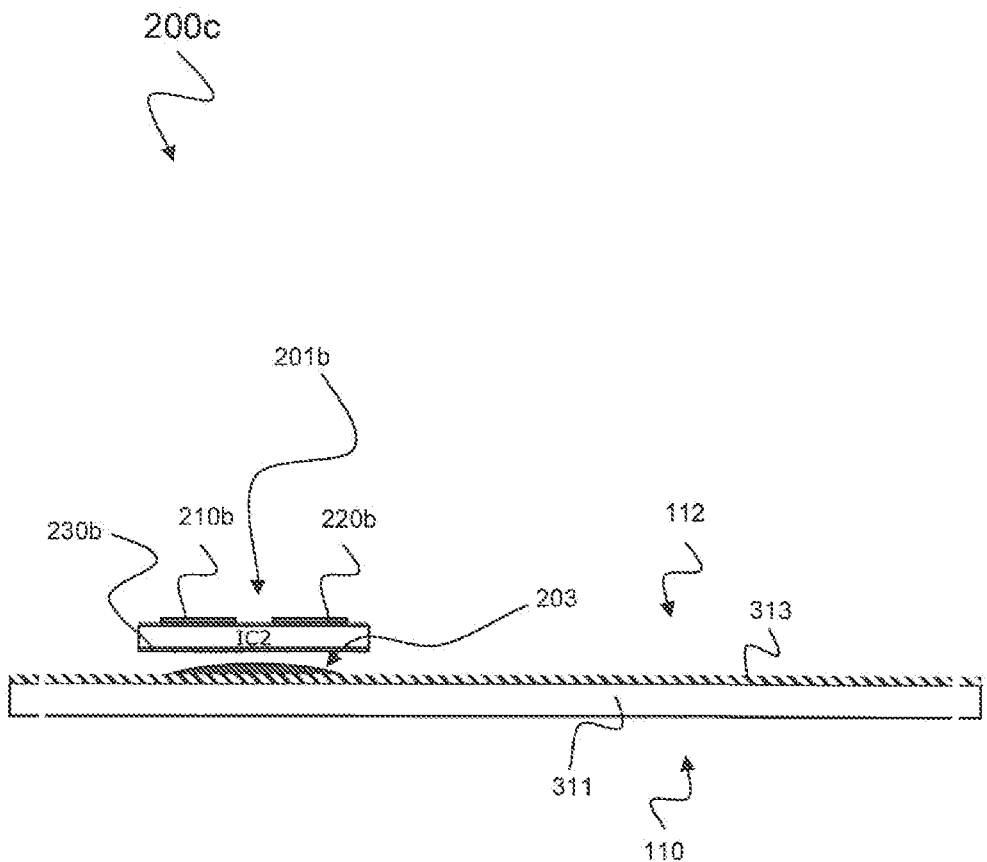
Figure 2D:
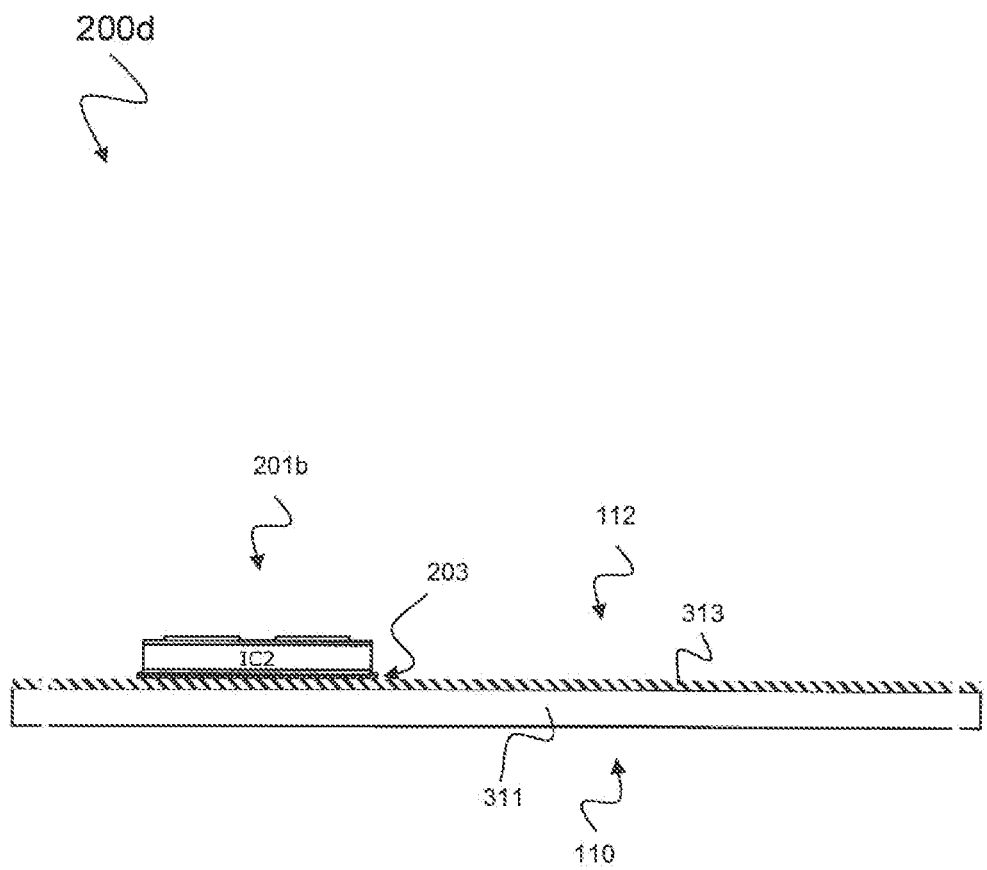

FIG. 2c and FIG. 2d schematically illustrate an exemplary act of component mounting 220c, 220d, wherein a second die IC2 201b may be mounted on a Cu foil 313 that may form the top side 110 of a layup as described below with respect to FIG. 3. A third die IC3 1201 that may be referred to as "thick die" is described below with respect to FIGS. 12 to 19. For performing the mounting act 220c, 220d, a high speed surface mount machine and insulation adhesive 205 may be used. A glue 205 may be printed on the Cu surface 313, for example by using standard paste printed and metal stencils. The second die IC2 201b may be mounted on top of the adhesive 205 by using a high speed and accurate pick and placement machine. The adhesive 205 may be cured by using a reflow or batch oven. In one example, the adhesive 205 may be pre-applied on the wafer back side, i.e. on the Cu foil 313, before attaching the second die IC2. The purpose of the adhesive 205 may be to fix the second die IC2 to the correct location. After that, the location of the second die IC2 can be measured and this data can e.g. be transferred to maskless imaging files. In one example, further dies (not shown in the Figures) may be mounted on the foil 313 next to the second die IC2. For a following layup process, structures with bottom-side mounted components (see FIGS. 2a and 2b) or structures with top-side mounted components (see FIGS. 2c and 2d) or both may be used.

Figure 3:
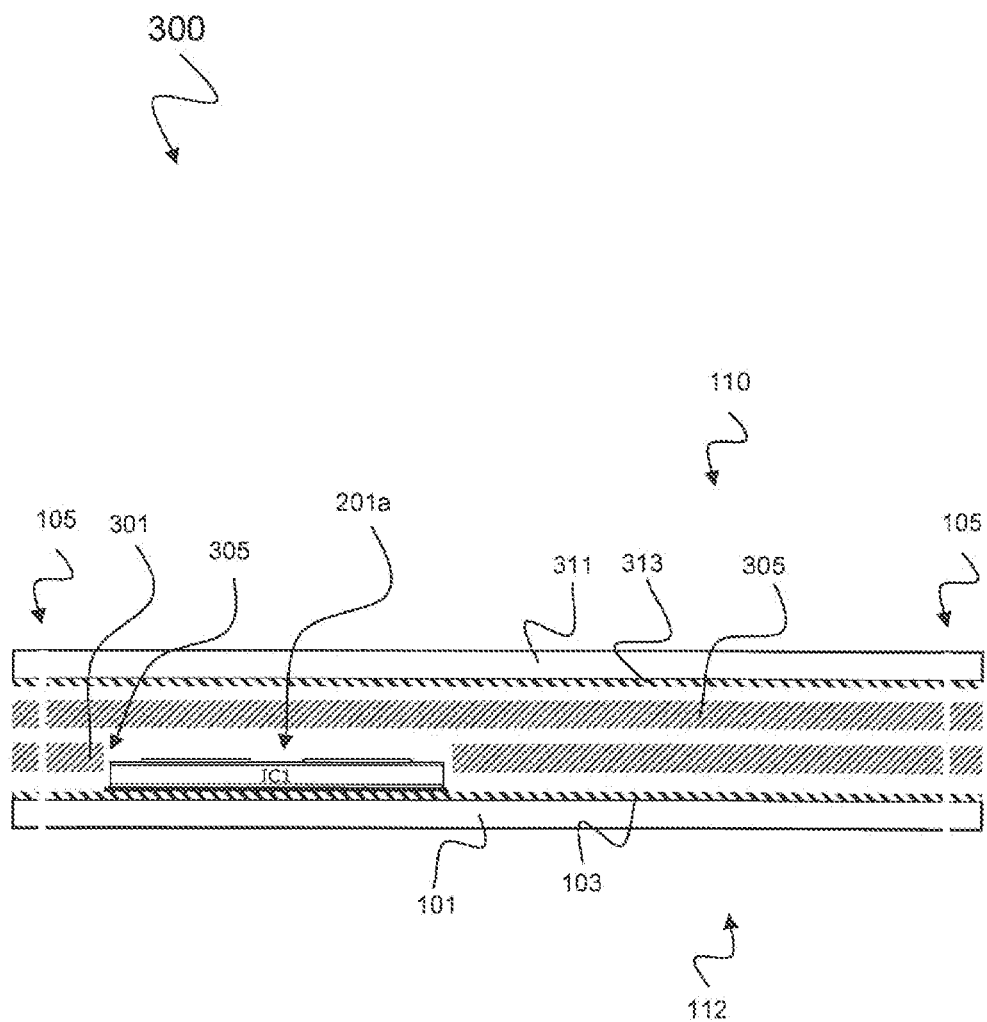

FIG. 3 schematically illustrates an exemplary layup act 300. After all dies are bonded either to the bottom-side Cu foil 103 or to the top-side Cu foil 313 or to both of them, the following layup process may be performed, for example on a base plate with aligning pins having fixed location. All layers may contain holes 105 for the aligning pins. The holes 105 and the pins may be used to accurately align the layers with respect to each other. The pins may be fixed to the base plate and may be used to keep the layers on a correct position during the lamination. In one example the layers may be bonded (e.g. point welded) together with a heated bonding tool outside the component area. In this example the fixed aligning pins may be removed before the lamination such that a linear thermal expansion of the structure may be achieved.

In another example, the layup process may be performed by using optical alignment, e.g. by applying an optical alignment tool such as a robot performing the optical alignment of the layers. The holes 105 in the layers may be used together with the optical alignment tool to accurately align the layers with respect to each other.

In one example, the layup may include the following layers:
a) The bottom foil 103 (optionally on carrier 101) with bonded dies 201a (face up on the foil).
b) A first insulation layer 301, e.g. a prepreg layer with cavities 305 for the components 201a on the bottom foil 103.
c) A second insulation layer (not shown), e.g. a prepreg layer or laminate with cavities for the components on the bottom foil 103 and top foil 313.
d) A third insulation layer 305, e.g. a prepreg layer with cavities for the components 201b on the top foil 313 (cavities not shown in the Figure as no components are mounted on top foil 313. However, if a top foil arrangement as depicted in FIG. 2d is used, the third insulation layer 305 may have cavities).
e) Top foil 313 (optionally on carrier 311) with bonded dies 201b (if needed face up 200b and face down 200d configuration inside the package).

The number of the insulation layers or prepregs may depend on the die thicknesses and the structures (face up 200b and face down 200d or only face up/face down) of the final product. In one example, a part or all of the insulation layers may be resin foils. In a further example, a part or all of the insulation layers may be laminates, e.g. built up by using adhesives. In yet another example, a part or all of the insulation layers may be resin foils and laminates (e.g. Cu foil—resin (bonding) film—laminate—resin (bonding) film —Cu foil). In one example the foils and prepreg materials may be standard PCB (Printed Circuit Board) materials as e.g. used in high volume HDI (High-Density Interconnect) PCB production. To minimize the warpage, a highly symmetrical structure may be is used (from top 110 to bottom 112).

Figure 4:
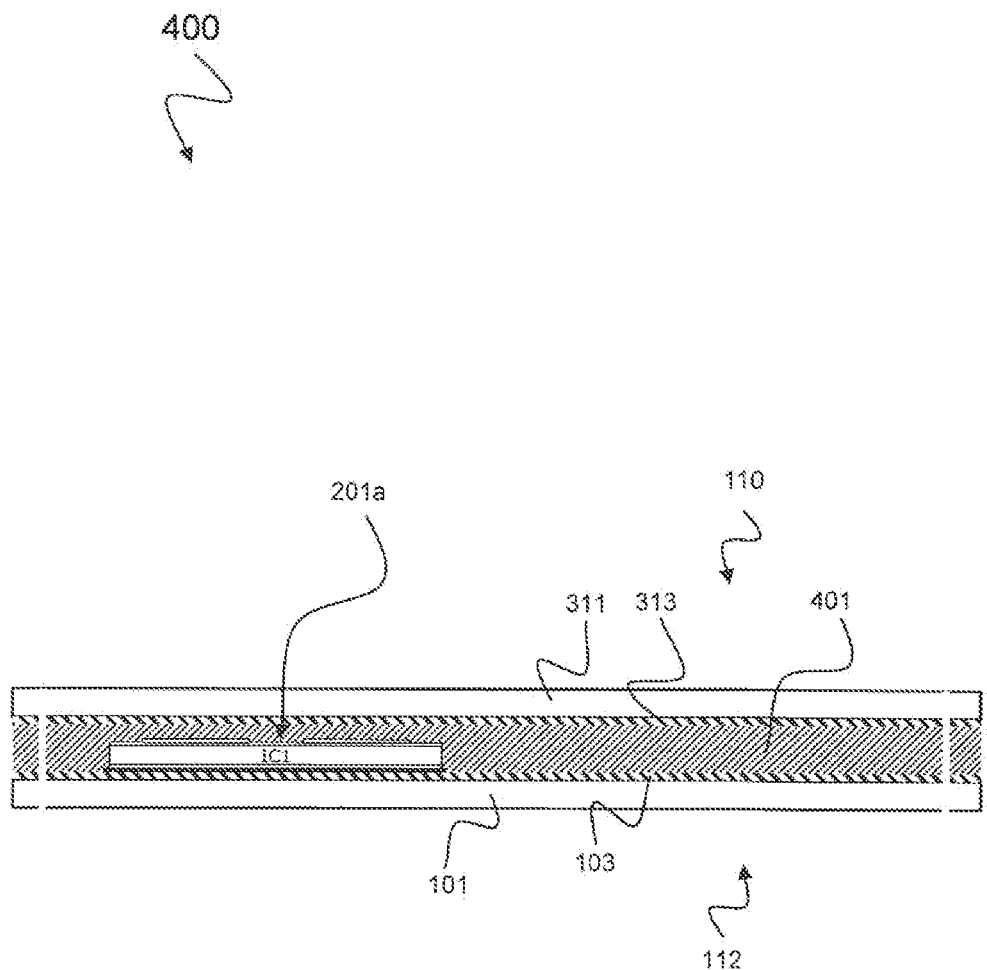

FIG. 4 schematically illustrates an exemplary pressing and lamination act 400 of the layup depicted in FIG. 3. The core layer lamination may be produced by using a PCB vacuum lamination press. During a first phase in the lamination cycle the B-stage resin in the prepreg, e.g. in the prepreg layers 301 and 305 as illustrated in FIG. 3, may be melted and may fill all cavities on the structured layer 103 and around the components 201a. The temperature may increase over the temperature at which the curing/cross linking process may start and may continue to increase until the polymer 401 may be fully cured.

Figure 5:
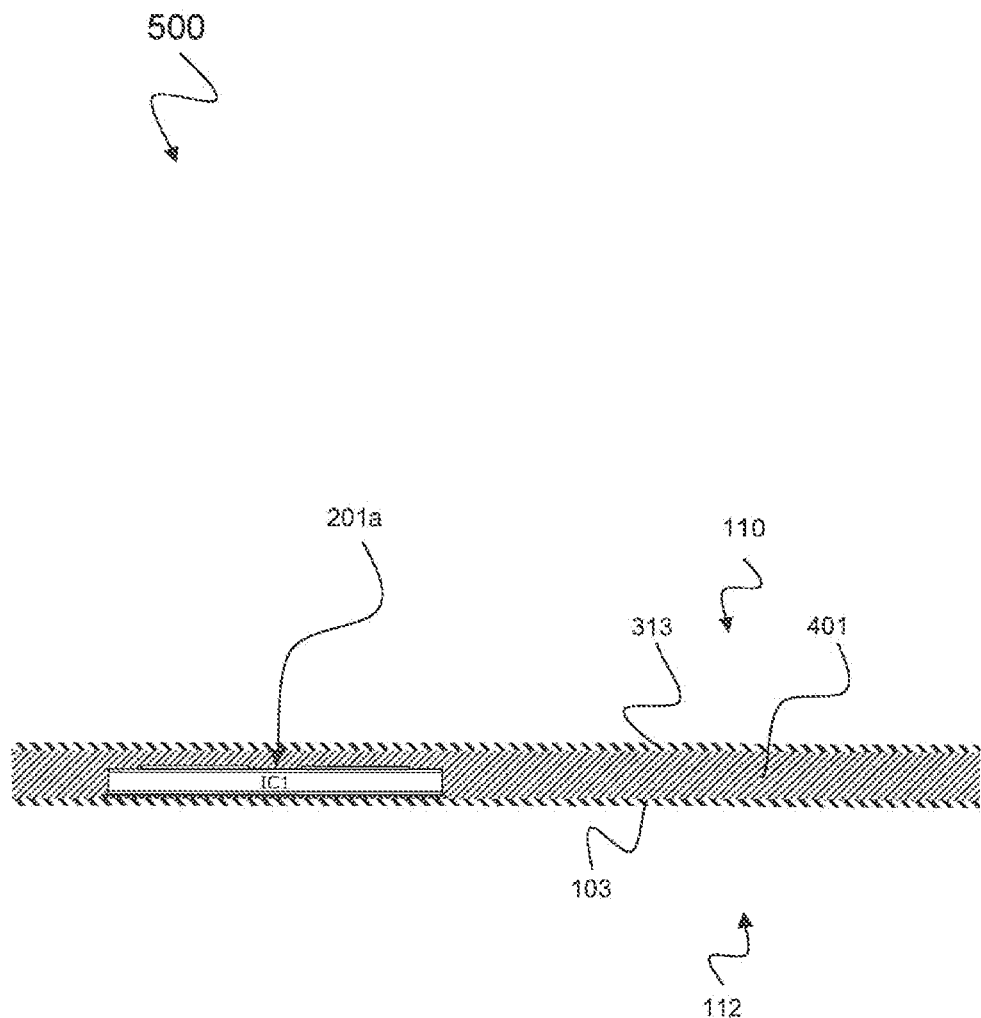

FIG. 5 schematically illustrates an optional carrier removal act 500. Since the carriers 101, 311 may be optional, the carrier removal act 500 may only be performed when the foils 103, 313, e.g. Cu foils are provided on a carrier foil 101, 311. After the lamination act 400, the carriers 101, 311 may be removed, for example via pealing (e.g. for a Cu carrier) or employing a wet etching process (e.g. for an Al carrier). In case of the Cu foil 103 arranged on the Cu carrier 101, the pealing after the lamination can be performed with relatively low force. For the case of the carrier foils 103, 313 being made of aluminum, these can be removed by etching, for example by using a warm etching solution such as e.g. 50 to 70 g/l, 40 to 80 g/l, 30 to 90 g/l, 55 to 65 g/l or 58 to 63 g/l Sodium Hydroxide (NaOH), e.g. in the range of about 60° C. to about 80° C., for example at 60° C., 62° C., 64° C., 66° C., 68° C., 70° C., 72° C., 74° C., 76° C., 78° C. or 80° C. The etching solution may be selective such that the layer arranged underneath may remain undamaged, i.e. the carrier 311 may be removed without damaging the foil 313.

Figure 6:
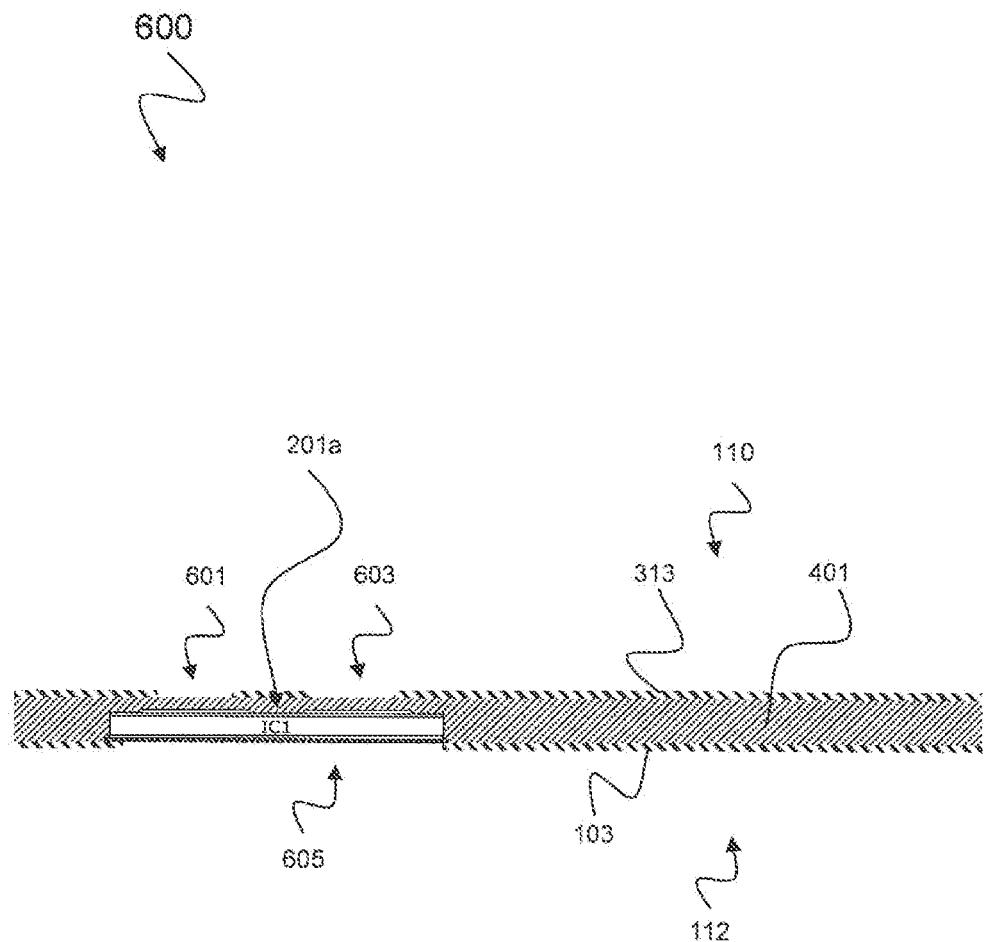

FIG. 6 schematically illustrates an exemplary act 600 of lithography and etching, e.g. Cu etching that may represent a lithography stepper preparation for a microvia manufacturing process on the die frontside 110 and a plating manufacturing process on the die back side 112. Openings 601, 603 in the front side 110 and a large opening 605 in the back side 112 may be formed e.g. by using a wet etching process with respect to the foils 103, 313 on the front side 110 and the back side 112. A first process step may include a lamination, e.g. a vacuum lamination of the photo resist on both sides 110, 112 of the panel. After the lamination process the resist may be exposed using a mask aligner or LDI (Laser Direct Imaging) or. An aligning may be performed by using the aligning marks that may have been manufactured in the laser drilling of the foils 103, 313 as described above with respect to FIG. 1. While the aligning marks for the component placement and lithography may be manufactured at the same time and in the same process, the aligning accuracy of the etching of via openings compared to die pad locations may be highly precise. After the exposure the resist may be developed. After the photolithography process, the openings 601, 603, 605 to the foil(s) 103, 313 may be produced by a wet etching process. Thereafter, a photoresist removal and cleaning of the foil(s) 103, 313 may follow.

Figure 7:
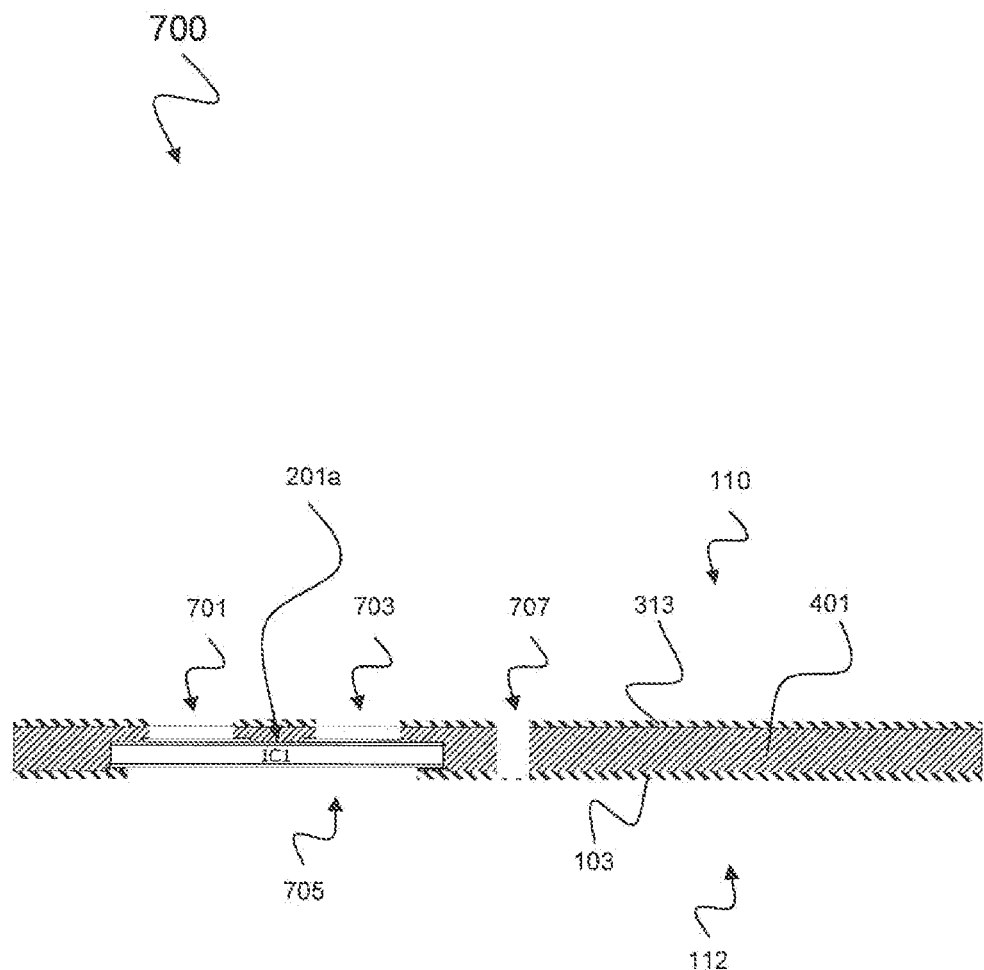

FIG. 7 schematically illustrates an exemplary act 700 of optional laser drilling. After the etching process as described above with respect to FIG. 6, the prepreg resin 401 may be removed from the microvia openings 701, 703, e.g. by using a CO2 laser drilling process which may use the remaining foil 313 as a mask. The microvia openings 701, 703 may be used for the chip front side. For the chip 201a back side large openings 705 may be used, for example openings that may cover nearly the whole chip 201a back side or a microvia matrix for the chip 201a back side. In one example, for the large back side openings 705, a plasma cleaning or a laser scanning process may be used to remove the resin layer. Additionally, the acts 600, 700 as described above with respect to FIGS. 6 and 7 may be performed when a direct laser drilling process or two step laser drilling or mechanical drilling is used. Furthermore, through holes 707 may be drilled, e.g. by mechanical drilling or by using laser drilling.

Figure 8:
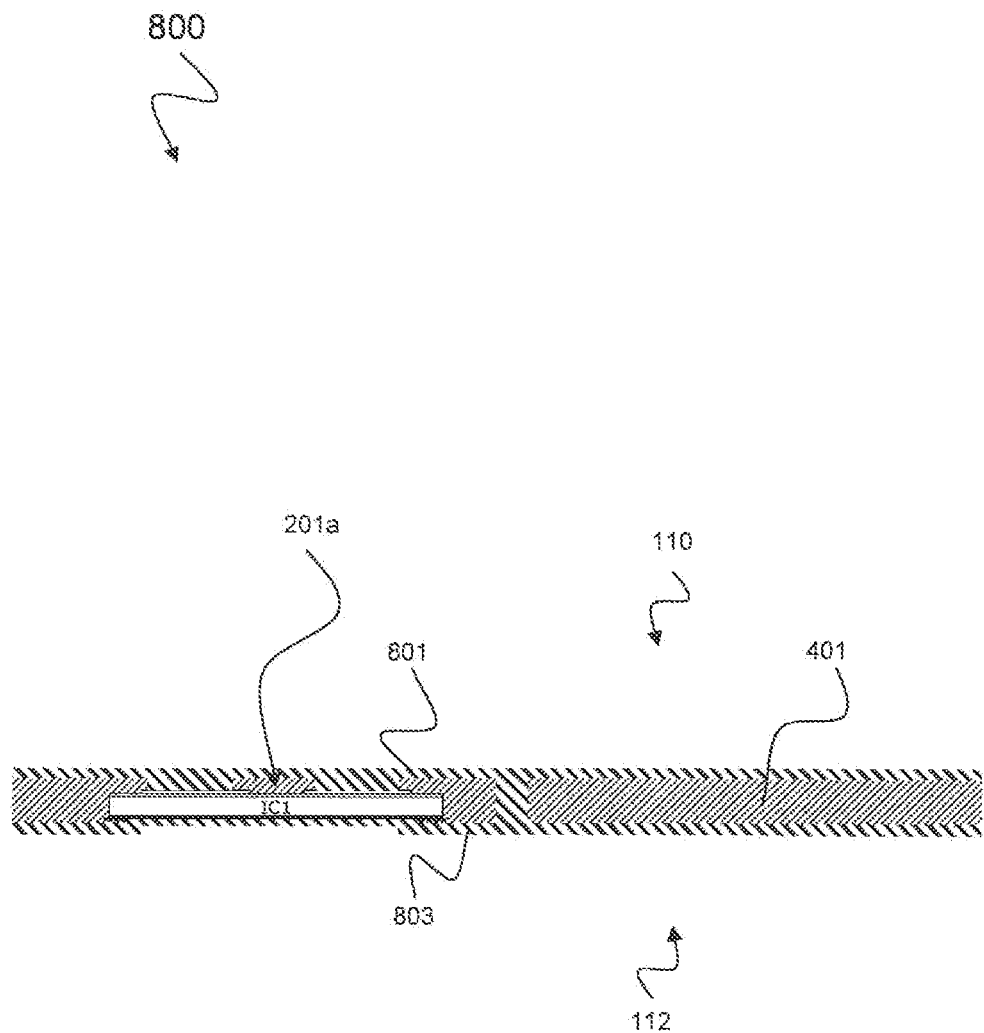

FIG. 8 schematically illustrates an exemplary act 800 of plating. The chip 201a front side and the back side of all components 201a, 201b (if the back side connection is required) may be connected to the conductor layer, that is the foil 103, e.g. Cu foil on the back side 112 and the foil 313, e.g. Cu foil on the front-side 110 of the laminate, by first plating a thin seed layer using a normal electroless plating process, e.g. an electroless copper plating process and then continuing with an electrochemical plating process or direct metallization process. After the plating process the front of the components 201a, i.e. the front-side 110 of the laminate, may be electrically connected to the foil 313, thereby forming a top metal layer 801, and the back side of the die 201a may be electrically connected to the embedded structure 103, thereby forming a bottom metal layer 803. The top metal layer 801 and the bottom metal layer 803 may be connected by the through holes 707 described with respect to FIG. 7.

Figure 9:
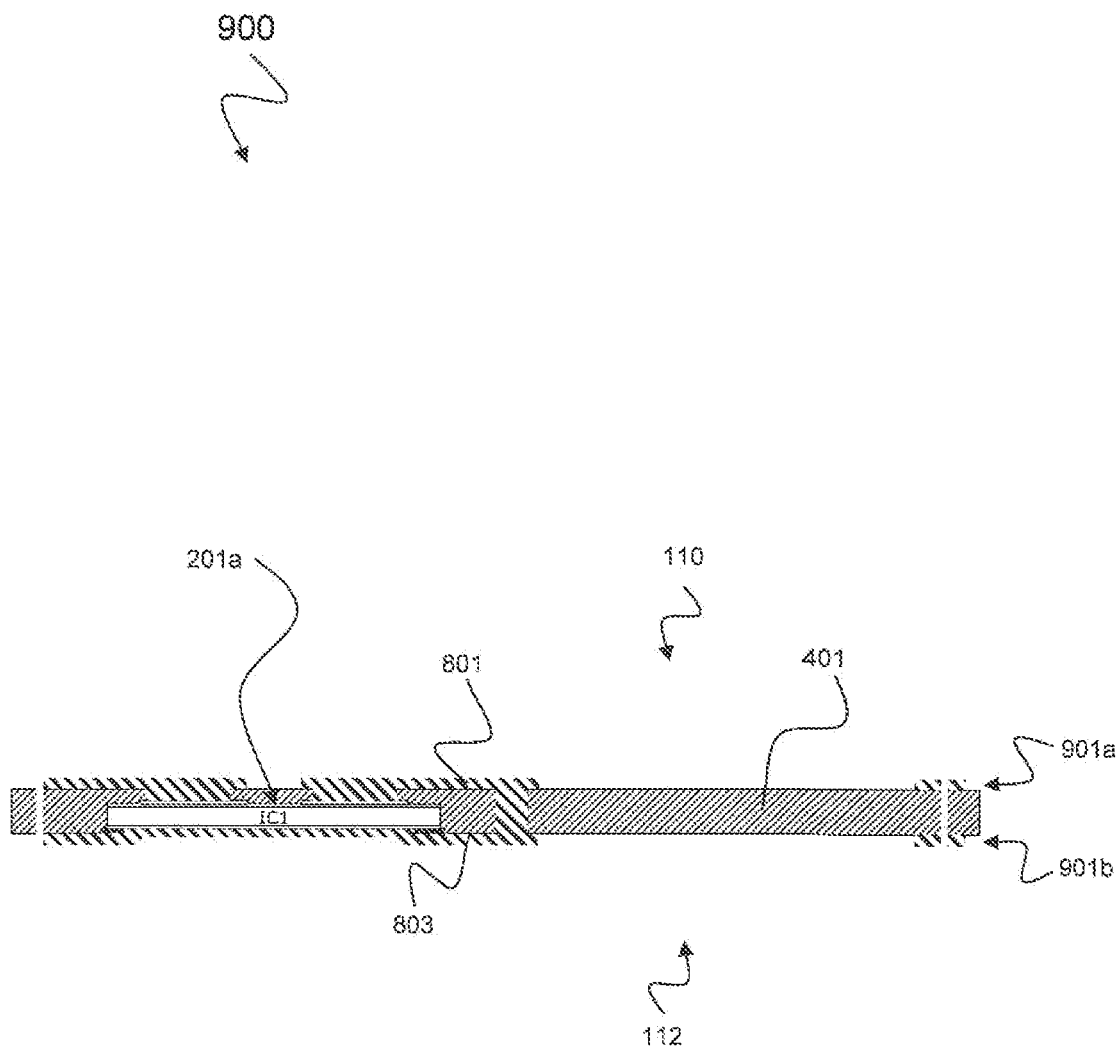

FIG. 9 schematically illustrates an exemplary act 900 of patterning. The conductor pattern 803 may be produced by using a DES process. The photoresist may be first coated on the both sides of the panel. The exposed and developed photoresist may then be used as a mask during the etching process. In one example, in addition to the panel plating process, a pattern plating process may be used.

FIGS. 10 to 19 as described in the following provide optional implementations and enhancements of the process as described above with respect to FIGS. 1 to 9.

Figure 10:
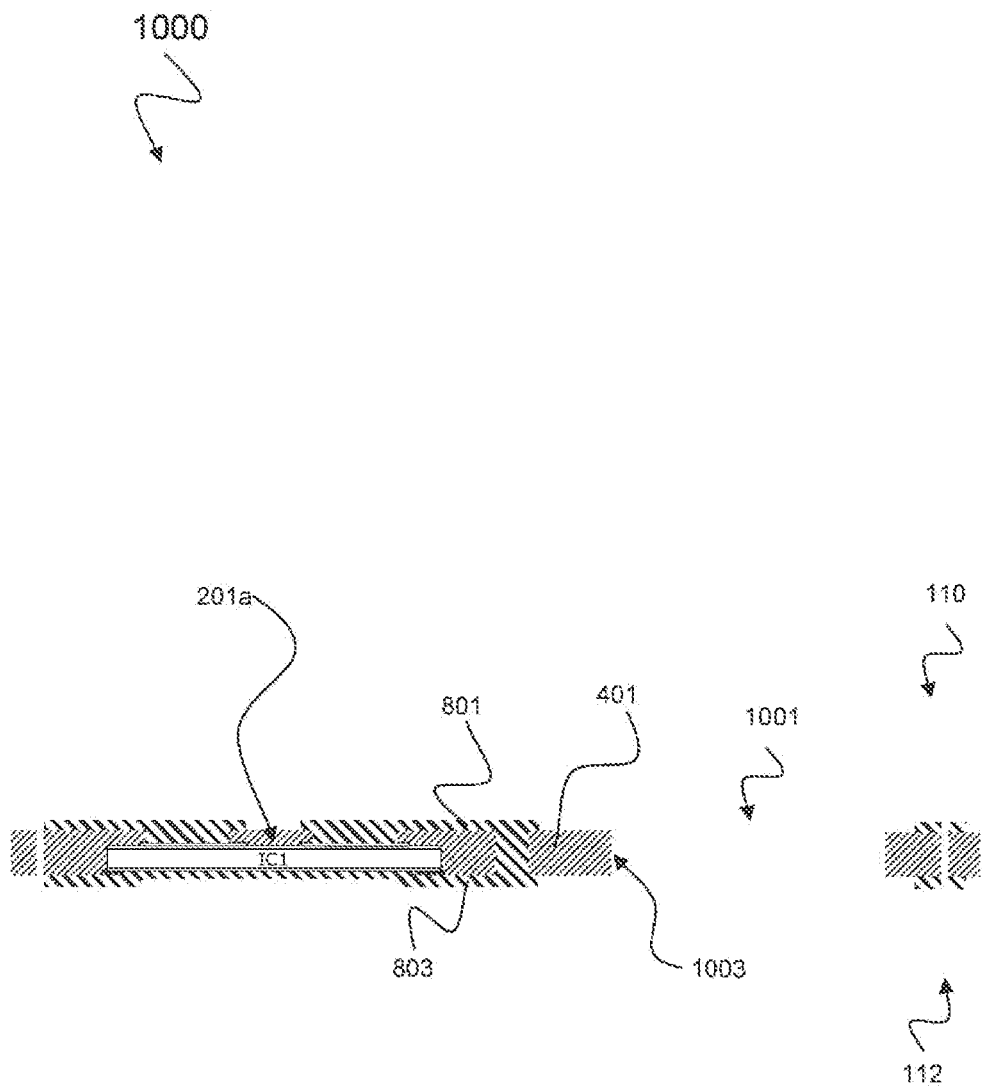
FIGS. 10 to 19 schematically illustrate a cross-sectional view of a method for providing an integrated circuit package including a first die IC1 and a third die IC3 where both dies are of different thickness.

FIG. 10 schematically illustrates an exemplary act 1000 of routing. The core layer 401 may be routed such that the thicker component 1201 (see FIG. 12) may be embedded inside the core layer cavity opening 1001 through the core layer 401. The routing act 1000 can be performed using a mechanical router or a laser drilling machine. In one example, the routing act 1000 may be performed before the plating process 800 of FIG. 8, e.g. in case cavity side walls may be needed also to be plated with copper, for example for EMI (Electro-Magnetic Influence) shielding of the thicker die 1201 as shown below with respect to FIG. 12.

FIGS. 11 to 19 schematically illustrate a cross-sectional view of a method for providing an integrated circuit package including a first die IC1 (that may also be referred to as thin die) and a third die IC3 (that may also be referred to as thick die), wherein both dies are of different thickness.

Figure 11:
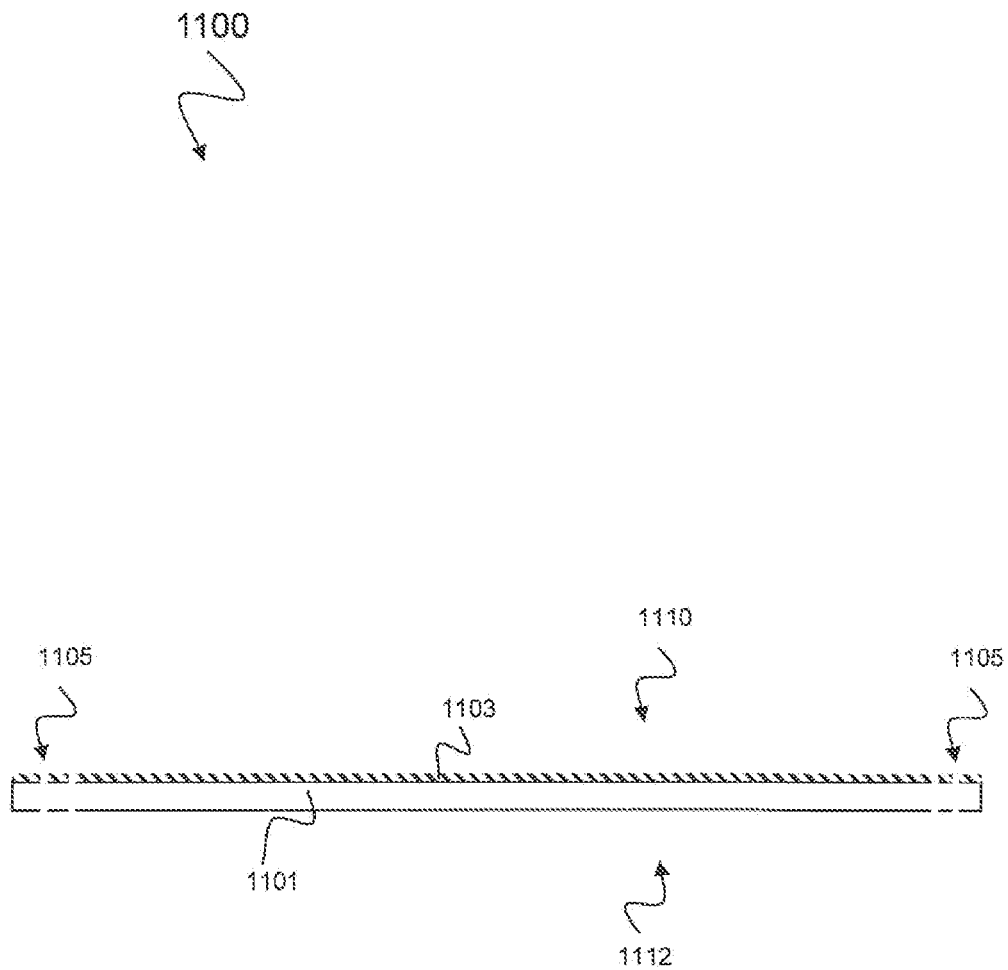

FIG. 11 schematically illustrates an exemplary act 1100 of laser drilling. The base material on which the thick dies 1201 may be mounted may be similar to that which may be used with thin dies 201a, 201b as described with respect to FIGS. 1 and 2, i.e. a thin functional foil 1103, e.g. Cu foil on a thick carrier 1101, e.g. Cu carrier. Aligning marks and jig holes 1105 used for solder printing, component assembly and lithography may be drilled to a large foil 1103, for example by using a laser, e.g. a UV laser.

Figure 12:
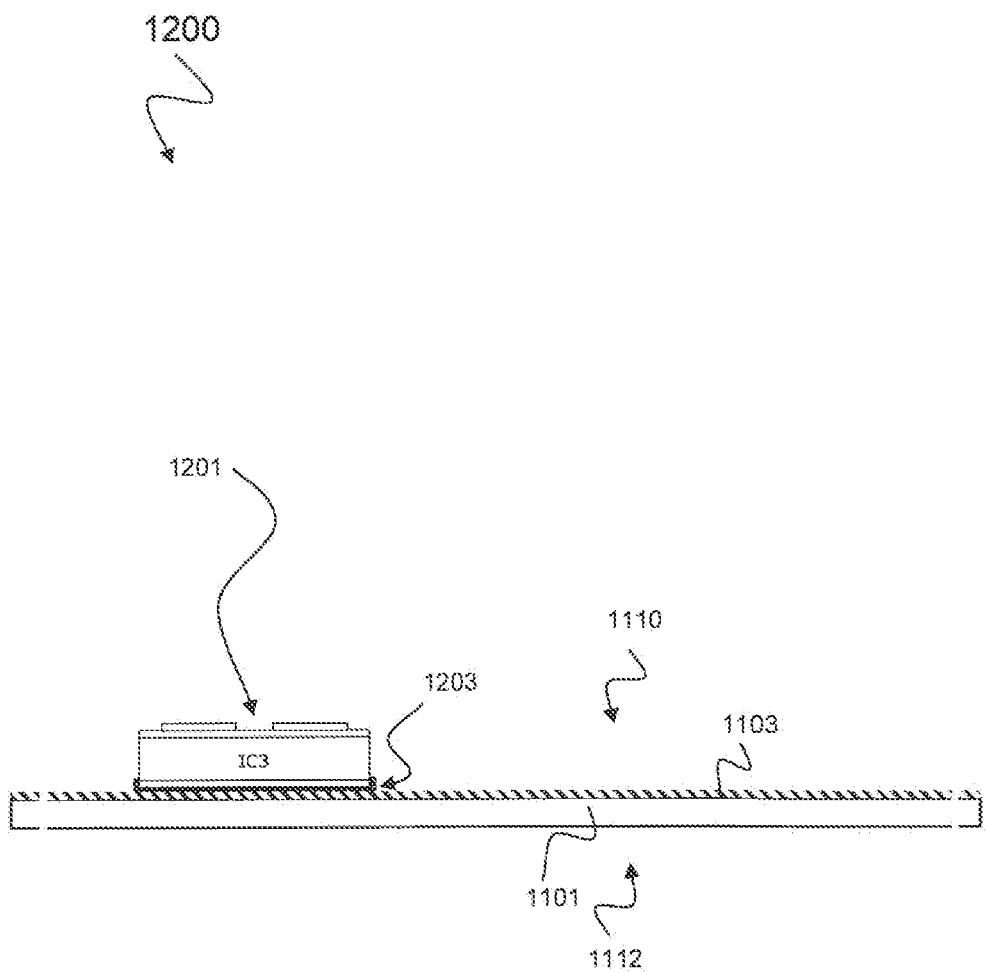

FIG. 12 schematically illustrates an exemplary act 1200 of component mounting of the thick dies 1201. Merely one thick die 1201 is illustrated in FIG. 12, but in further examples multiple thick dies may be mounted. The thick dies 1201 may be mounted on the foil 1103 by using a process similar to the process used in connection with the thin dies 201a, 201b (see FIGS. 2a to 2d). The manufacturing may be performed by using a high speed surface mount machine and a non-conducting adhesive 1203. The glue 1203 may be printed on the surface 1103 by using standard paste printed and metal stencils. The dies 1201 may be mounted on top of the adhesive 1203 by using a high speed and accurate pick and placement machine. The adhesive 1203 may be cured by using a reflow or batch oven.

Figure 13:
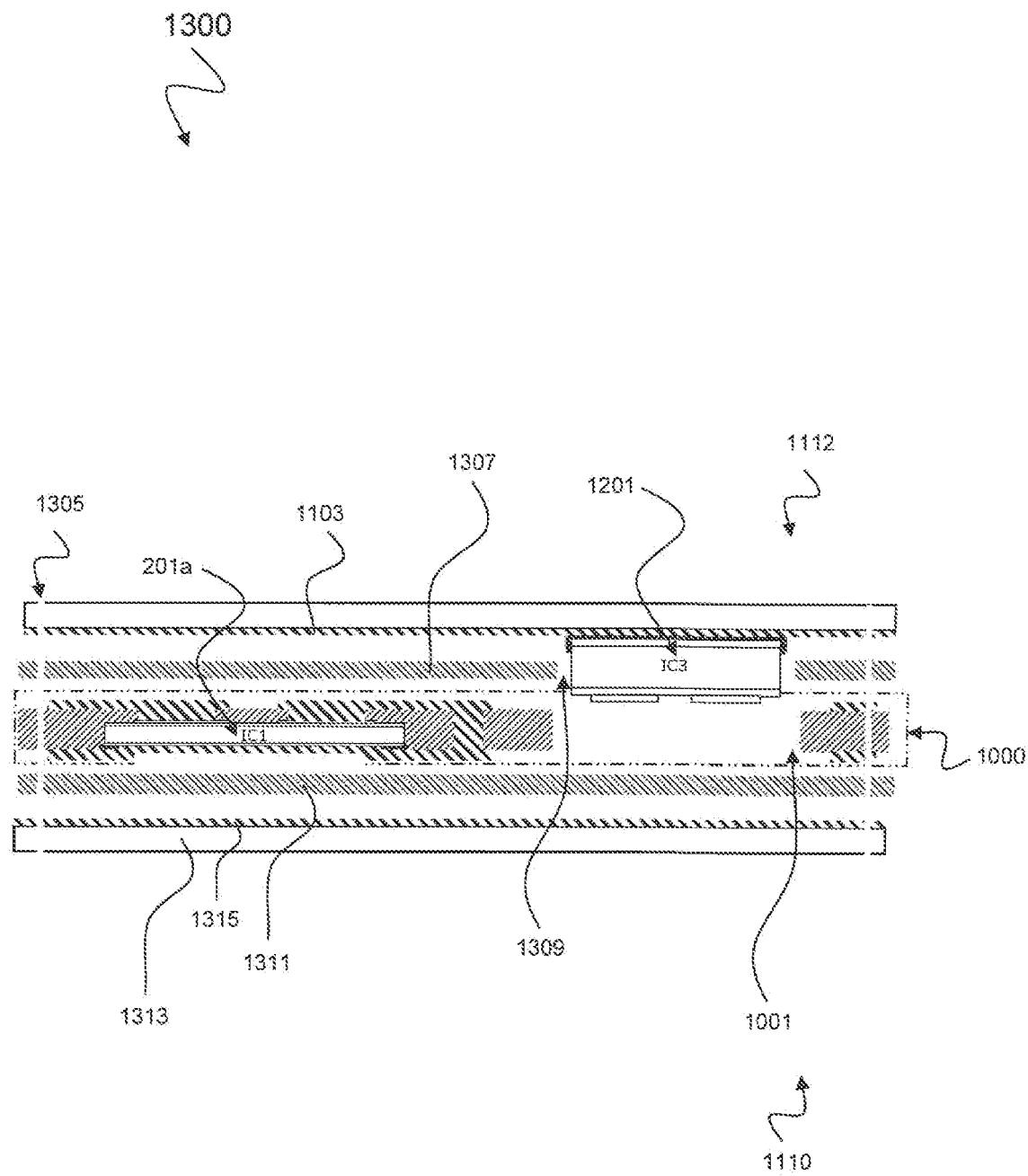

FIG. 13 schematically illustrates an exemplary (second) layup process 1300. After all dies 201a, 1201 may have been bonded to the foil(s) 1103, a second layup process 1300 may be performed. This can be done in the same way as described with respect to FIG. 3, for example by using a base plate including aligning pins on a fixed location. All layers may contain holes 1305 for the aligning pins. The holes 1305 and pins may be used to accurately align the layers with respect to each other. In one example, such a layup may contain e.g. at least the following layers:

a) A bottom foil 1103, e.g. a Cu foil, with or without bonded thick dies 1201 (e.g. face up on the foil 1103 as illustrated in FIG. 13).
b) A first insulation layer 1307, e.g. a prepreg layer with cavities 1309 for the components.

c) A core layer 1000 with embedded thin dies 201*a* and routed cavities 1001 for the thick dies 1201.
d) A second insulation layer 1311, e.g. a prepreg layer.
e) A top foil 1315, e.g. a Cu foil, with or without bonded thick dies.

During the layup 1300 the thick dies 1201 may be placed on a cavity 1309 on the first insulation or prepreg layer 1307 and on the core laminate 1000.

Figure 14:
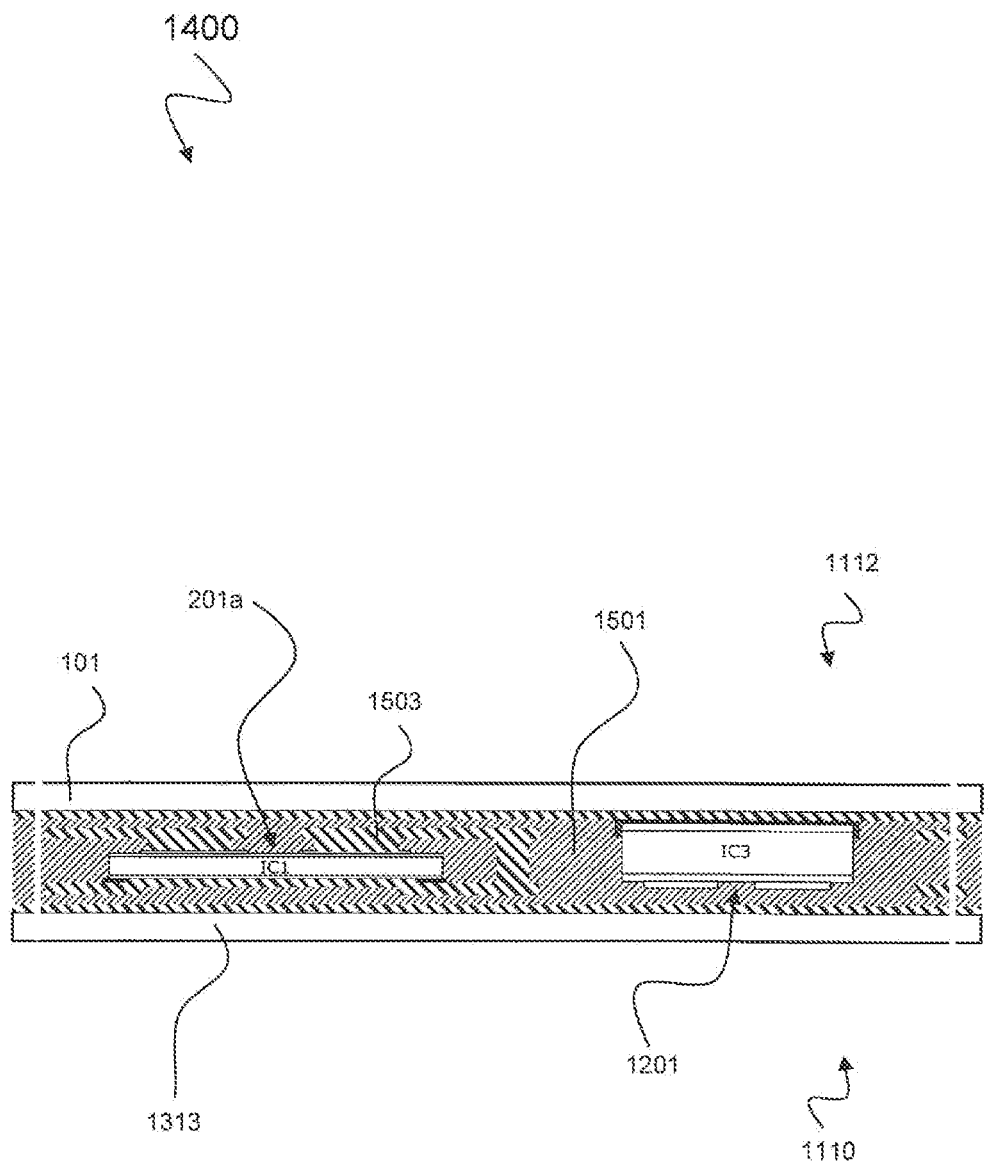

FIG. 14 schematically illustrates an exemplary (second) lamination process 1400. The panel may be laminated, for example by using a PCB vacuum lamination press. During the lamination the prepreg resin may fill all cavities on the structured core layer 1000 and around the thick components 1201 and may bond the layers together to provide a laminated panel 1501.

Figure 15:
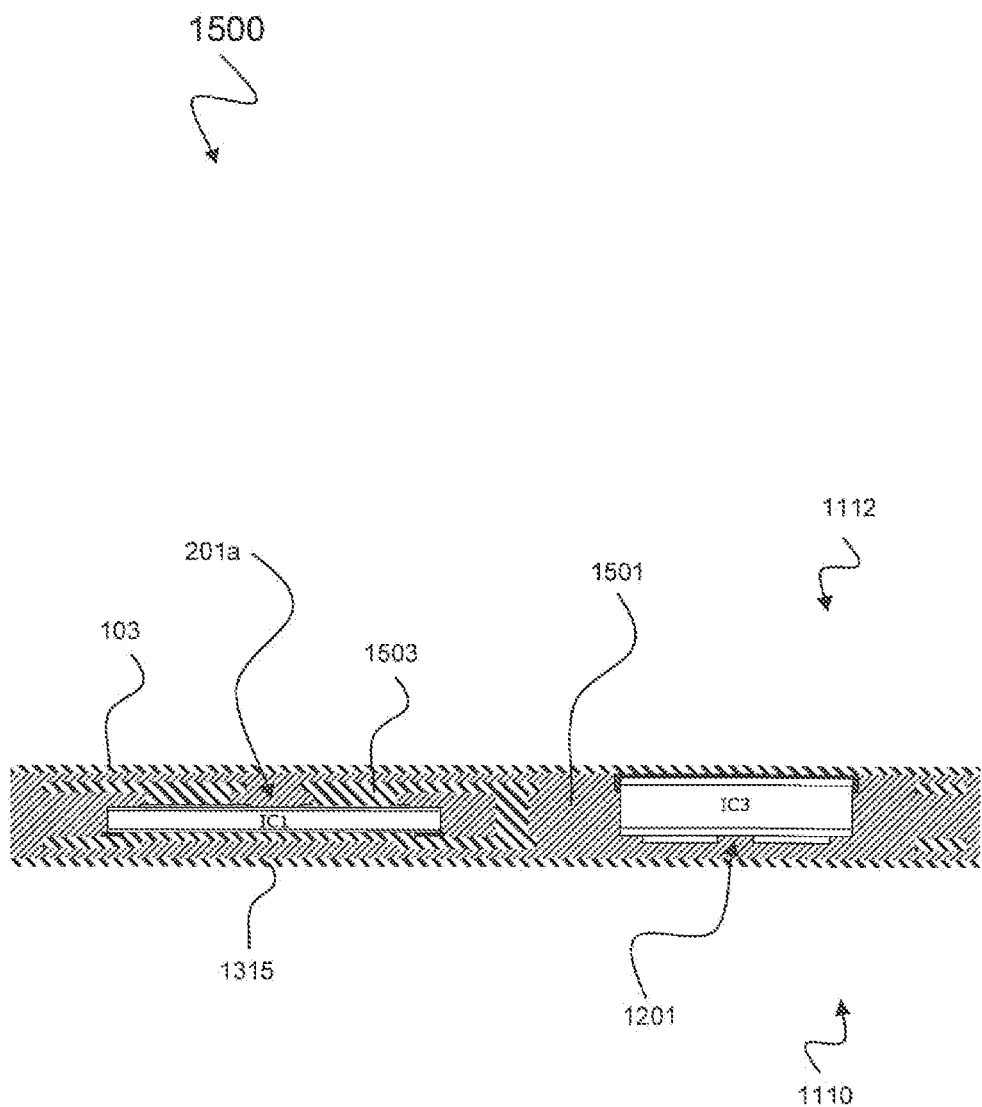

FIG. 15 schematically illustrates an optional act 1500 of carrier removal. The carriers 101, 1313 may be removed, e.g. by pealing (e.g. in case of a Cu carrier 101, 1313) or using an etching process (e.g. in case of an Al carrier 101, 1313). A similar process is described with respect to FIG. 5 for the core layer manufacturing step.

Figure 16:
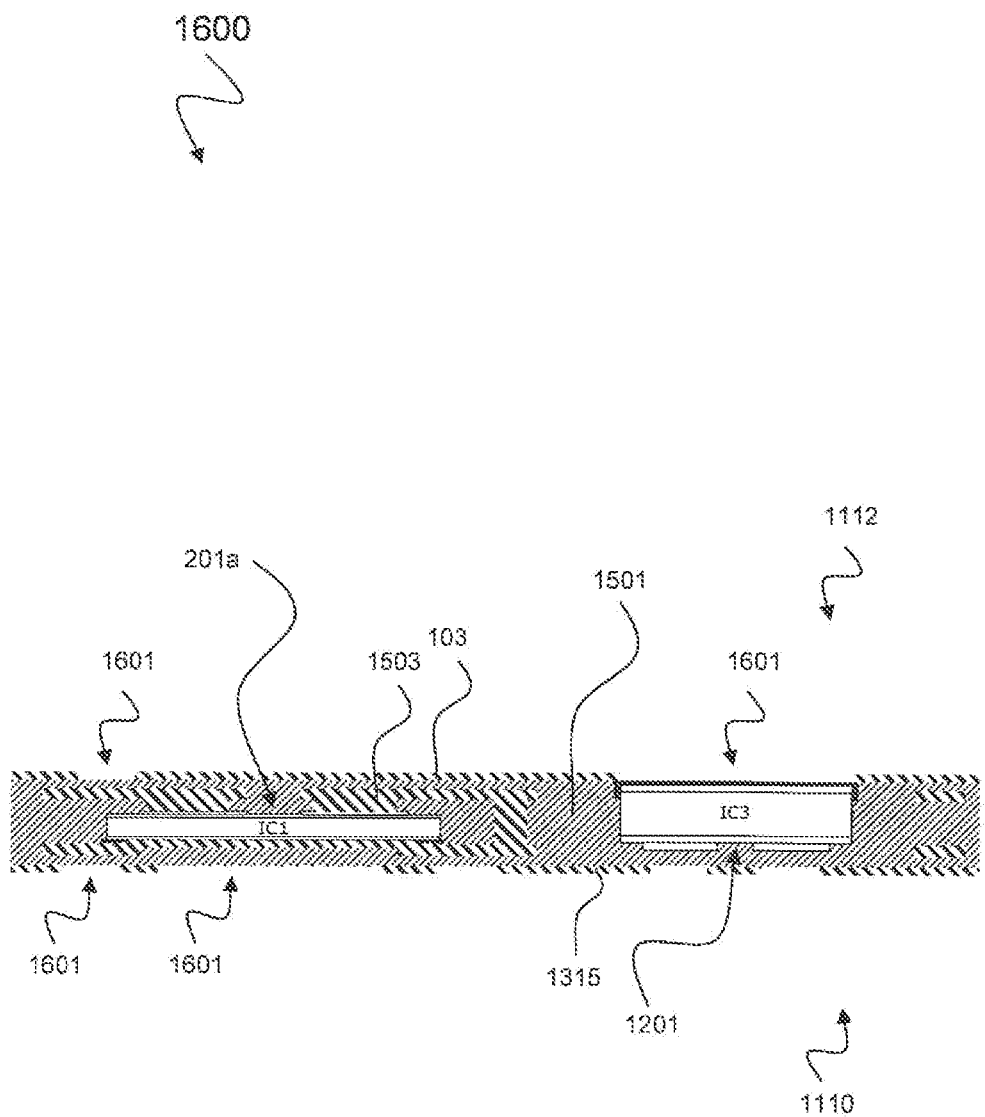

FIG. 16 schematically illustrates an exemplary (second) act 1600 of lithography and etching. The microvias to the thick dies 1201 and core layer 1000 may be produced in two steps. Openings 1601 to the foils 103, 1315 may be produced by using the similar lithography and etching process 600 as described with respect to FIG. 6 that may be used in the core layer manufacturing step.

Figure 17:
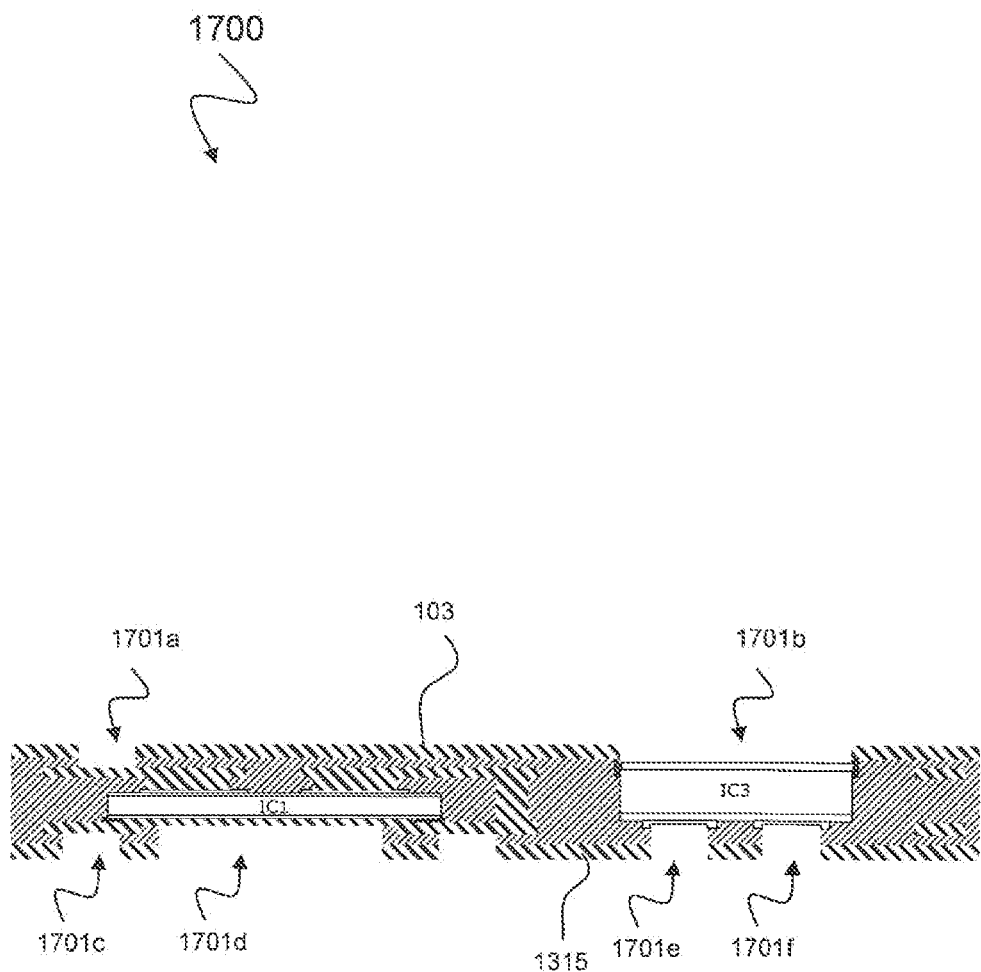

FIG. 17 schematically illustrates an exemplary (second) act 1700 of laser drilling. The microvias may be drilled by using a CO2 laser drilling process, for example by using the remaining foil 103, 1315 as a mask. In one example, in addition to the described process, the steps described in connection with FIGS. 16 and 17 may also be performed, for example when a direct laser drilling process may be used.

Figure 18:
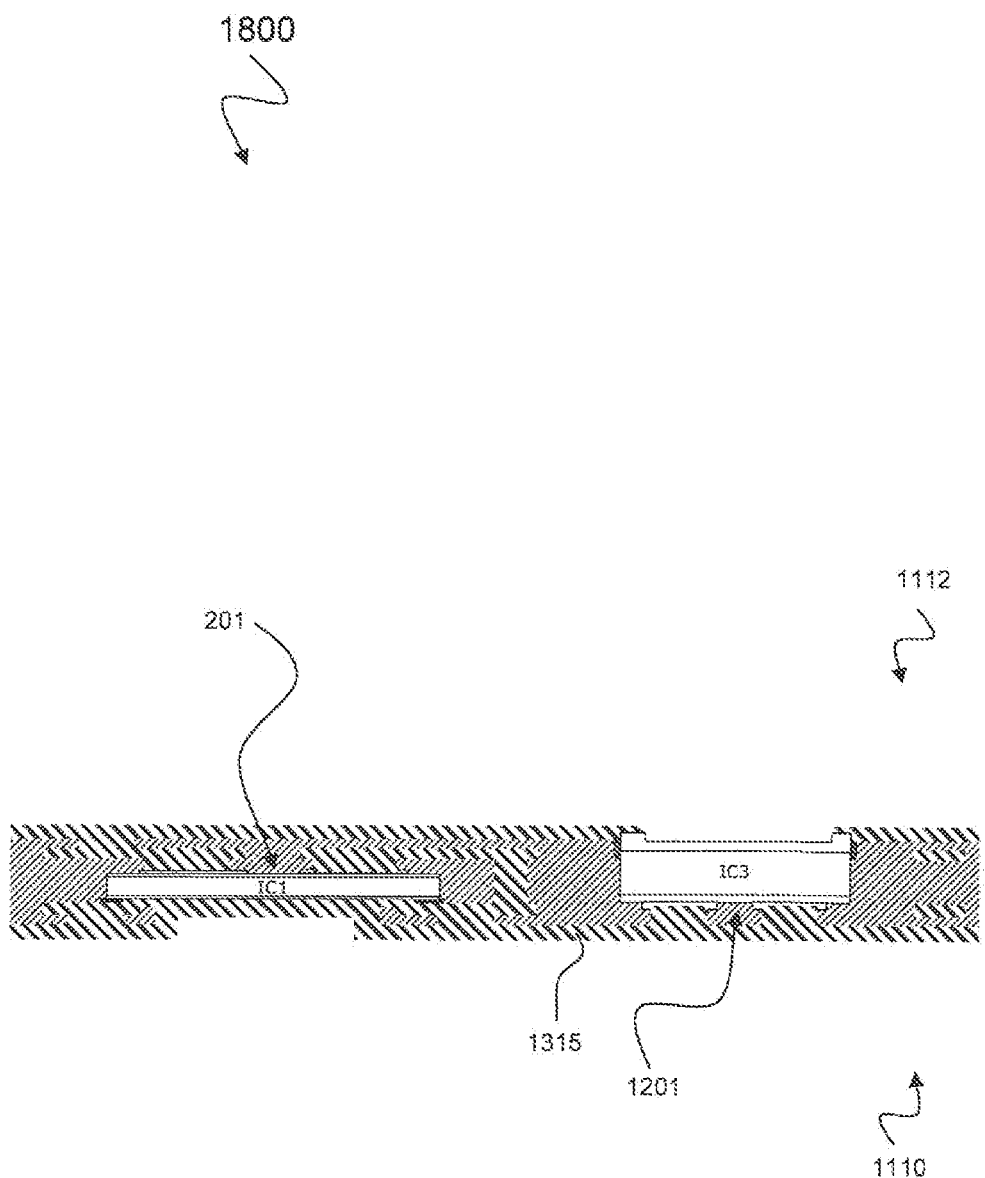

FIG. 18 schematically illustrates an exemplary (second) plating act 1800. The chip front side of all components 201*a*, 1201 may be connected to the conductor layer 1315 on the buildup layer by first plating a thin seed layer, for example by using an electroless plating, e.g. copper plating process and then continuing with an electrochemical plating process or direct metallization process. After the plating process 1800, the front of the components 201*a*, 1201 may be electrically connected to the foil 1315.

Figure 19:
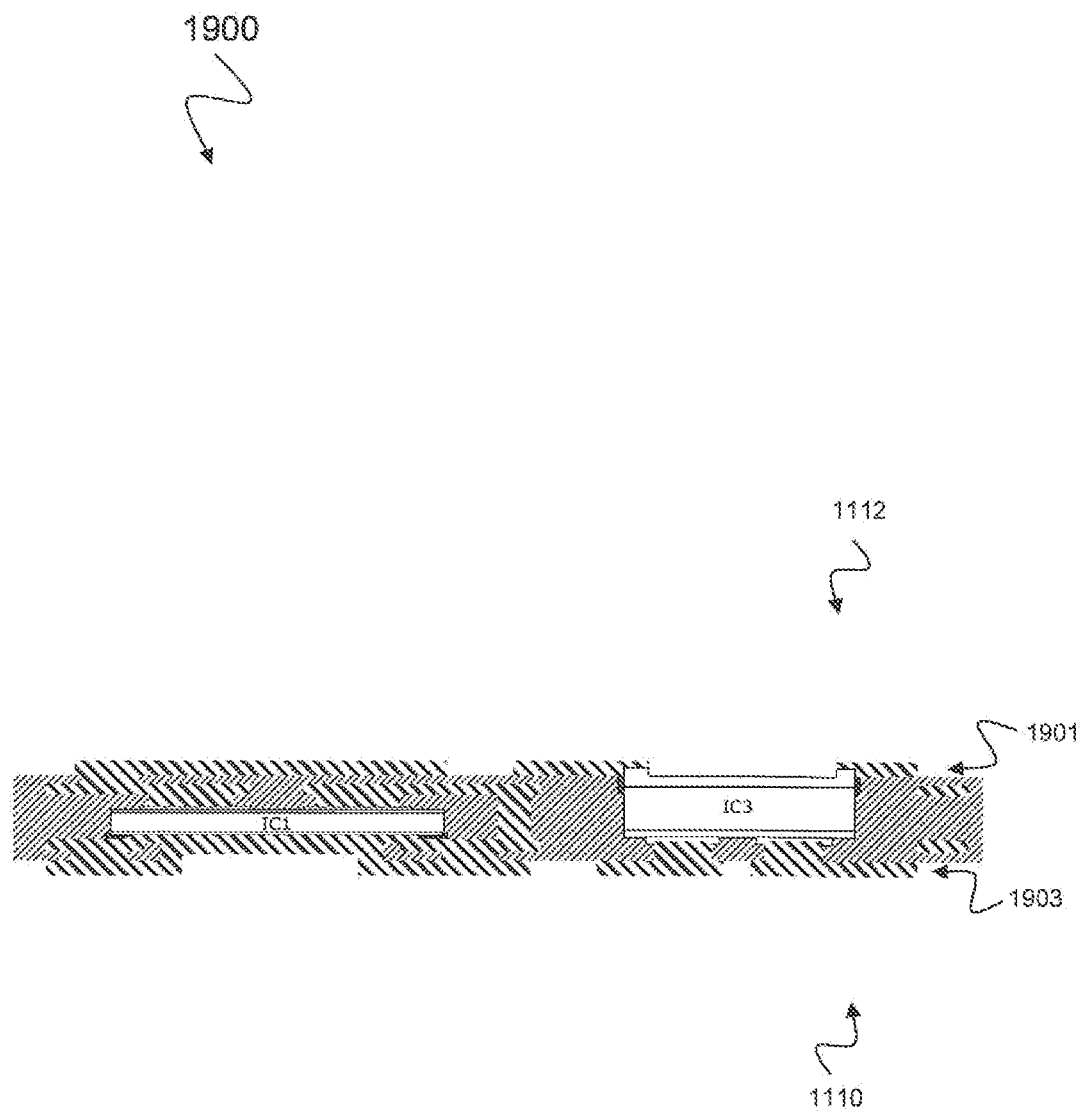

FIG. 19 schematically illustrates an exemplary (second) patterning act 1900. The conductor pattern 1901, 1903 may be produced by using a DES process. The photoresist may be coated on both sides 1110, 1112 of the panel. The exposed and developed photoresist may be used as a mask during the etching process. In one example, in addition to a panel plating process, a pattern plating process may be employed.

In further examples, additional build up layers may be manufactured on both sides of the module before the solder masking, surface finishing, solder bumping and package separation.

Figure 20:
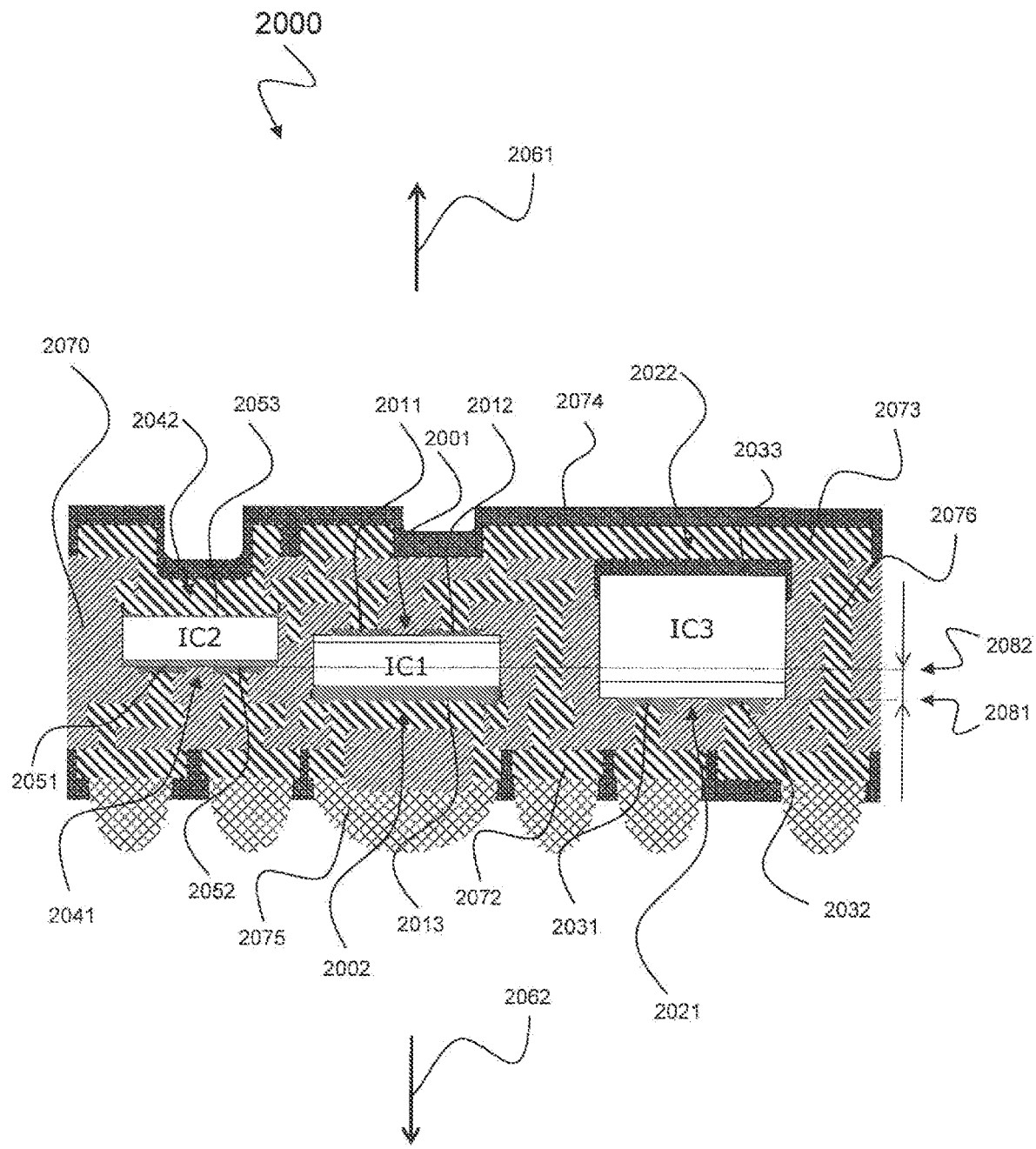
FIG. 20 schematically illustrates a cross-sectional view of a device 2000 including a first die IC1, a second die IC2 and an optional third die IC3.

FIG. 20 schematically illustrates a cross-sectional view of a device, e.g. an integrated circuit package, including a first semiconductor chip IC1 and a second semiconductor chip IC2. The first semiconductor chip IC1 may be of a first thickness and the second semiconductor chip IC2 may be of a second thickness approximately corresponding to the first thickness.

The first semiconductor chip IC1 may include a first face 2001 facing in a first direction 2061. A first contact pad 2011 of the first semiconductor chip IC1 may be arranged over the first face 2001 of the first semiconductor chip IC1. The second semiconductor chip IC2 may include a first face 2041 facing in a second direction 2062 opposite the first direction 2061. A first contact pad 2051 of the second semiconductor chip IC2 may be arranged over the first face 2041 of the second semiconductor chip IC2. A second contact pad 2052 of the second semiconductor chip IC2 may be arranged over the first face 2041 of the second semiconductor chip IC2. A third contact pad 2053 of the second semiconductor chip IC2 may be arranged over a second face 2042 of the second semiconductor chip IC2 opposite to the first face 2041 of the second semiconductor chip IC2. The first semiconductor chip IC1 may be located laterally outside of an outline of the second semiconductor chip IC2.

In one example, one or both of the first semiconductor chip IC1 and the second semiconductor chip IC2 may include a power semiconductor. In one example, one or both of the first semiconductor chip IC1 and the second semiconductor chip IC2 may include a logic semiconductor, e.g. a switching logic semiconductor, a network semiconductor or a communication terminal semiconductor. The first semiconductor chip IC1 may include a second contact pad 2012 arranged over the first face 2001 of the first semiconductor chip IC1 and a third contact pad 2013 arranged over a second face 2002 of the first semiconductor chip IC1 opposite to the first face 2001 of the first semiconductor chip IC1. In one example, the first and second contact pads 2011, 2012 may be source and gate contact pads and the third contact pad 2013 may be a drain contact pad.

In one example, the first face 2001 of the first semiconductor chip IC1 and a second face 2042 of the second semiconductor chip IC2 opposite to the first face 2041 of the second semiconductor chip IC2 may be arranged on different heights. In one example, the first face 2001 of the first semiconductor chip IC1 and the first face 2041 of the second semiconductor chip IC2 may be arranged on different heights. In one example, the second face 2002 of the first semiconductor chip IC1 and the first face 2041 of the second semiconductor chip IC2 may be arranged on a same height.

The device 2000 may include a material layer 2070 in which the first semiconductor chip IC1 and the second semiconductor chip IC2 may be at least partly embedded. The material layer 2070 may include at least one of a prepreg, a resin, a laminate, an epoxy, a filled epoxy, glass fiber filled epoxy, an imide, a duroplast or a thermoplast polymer or polymer blend and any other insulation layer. The device 2000 may further include a patterned electrically conductive layer 2072 arranged over the second face 2002 of the first semiconductor chip IC1 and electrically coupled to the third contact pad 2013 of the first semiconductor chip IC1 by a plated connection. The patterned electrically conductive layer 2072 may be arranged over the first face 2041 of the second semiconductor chip IC2 and may be electrically coupled to the first contact pad 2051 of the second semiconductor chip IC2 by a via connection.

The device 2000 may include a second patterned electrically conductive layer 2073 that may be arranged over the first face 2001 of the first semiconductor chip IC1 and may be electrically coupled to the first and/or second contact pad 2011, 2012 of the first semiconductor chip IC1 by a via connection. The second patterned electrically conductive layer 2073 may be arranged over the second face 2042 of the second semiconductor chip IC2 and may be electrically coupled to the third contact pad 2053 of the second semiconductor chip IC2 by a plated connection. The device 2000 may include an insulation layer 2974 arranged over a top surface of the device 2000. In one example, the insulation layer 2074 may fully isolate the device 2000 to the top side. In one example, bumps 2075 may be attached on the patterned electrically conductive layer 2072 to provide external contacts of the device 2000. In one example, the bumps 2075 may be only contacted from the bottom side of the device 2000 such that the device 2000 may only be externally contacted from the bottom side. In one example, further vias 2076 may be arranged to couple the patterned electrically conductive layer 2072 with the second patterned electrically conductive layer 2073.

The device 2000 may optionally include a third semiconductor chip IC3 arranged laterally outside of an outline of the first semiconductor chip IC1 and laterally outside of an outline of the second semiconductor chip IC2. The third semiconductor chip IC3 may be of a third thickness different from the first thickness of the first semiconductor IC1 and different from the second thickness of the second semiconductor chip IC2.

A first contact pad 2031 of the third semiconductor chip IC3 may be arranged over a first face 2021 of the third semiconductor chip IC3. A second contact pad 2032 of the third semiconductor chip IC3 may be arranged over the first face 2021 of the third semiconductor chip IC3. A third contact pad 2033 of the third semiconductor chip IC3 may be arranged over a second face 2022 of the third semiconductor chip IC3 opposite to the first face 2021 of the third semiconductor chip IC3.

In one example, the first face 2021 of the third semiconductor chip IC3 may be positioned on a first height 2081 and the first face 2041 of the second semiconductor chip IC2 may be positioned on a second height 2082 different from the first height 2081.

In one example, the first face 2041 of the second semiconductor chip IC2 may be positioned on a second height 2082 which may be located between the first height 2081 of the first face 2021 of the third semiconductor chip IC3 and a height of the second face 2922 of the third semiconductor chip IC3. In one example, the first face 2041 of the second semiconductor chip IC2 may be positioned on a second height 2082 which may be located between a height of the second face 2002 of the first semiconductor chip IC1 and a height of the first face 2001 of the first semiconductor chip IC1. In one example, the first face 2001 of the first semiconductor chip IC1 may be positioned on a height which may be located between the first height 2081 of the first face 2021 of the third semiconductor chip IC3 and a height of the second face 2022 of the third semiconductor chip IC3.

In one example, the device 2000 may comprise the first semiconductor chip IC1 and the second semiconductor chip IC2 which may be approximately of the same thickness. The device 2000 may be manufactured by using the process as described with respect to FIGS. 1 to 9. The device 2000 may optionally comprise the third semiconductor chip IC3 having a different thickness, e.g. thicker than IC1 and IC2. The device 2000 including the third semiconductor chip IC3 may be manufactured by additionally using the process as described with respect to FIGS. 10 to 19.

In a further example, the device 2000 may comprise the first semiconductor chip IC1 and the third semiconductor chip IC3 having a different thickness, e.g. thicker than the first semiconductor chip IC1. The device 2000 may be manufactured by using the process as described with respect to FIGS. 1 to 19. The device 2000 may optionally comprise the second semiconductor chip IC2.

Figure 21:
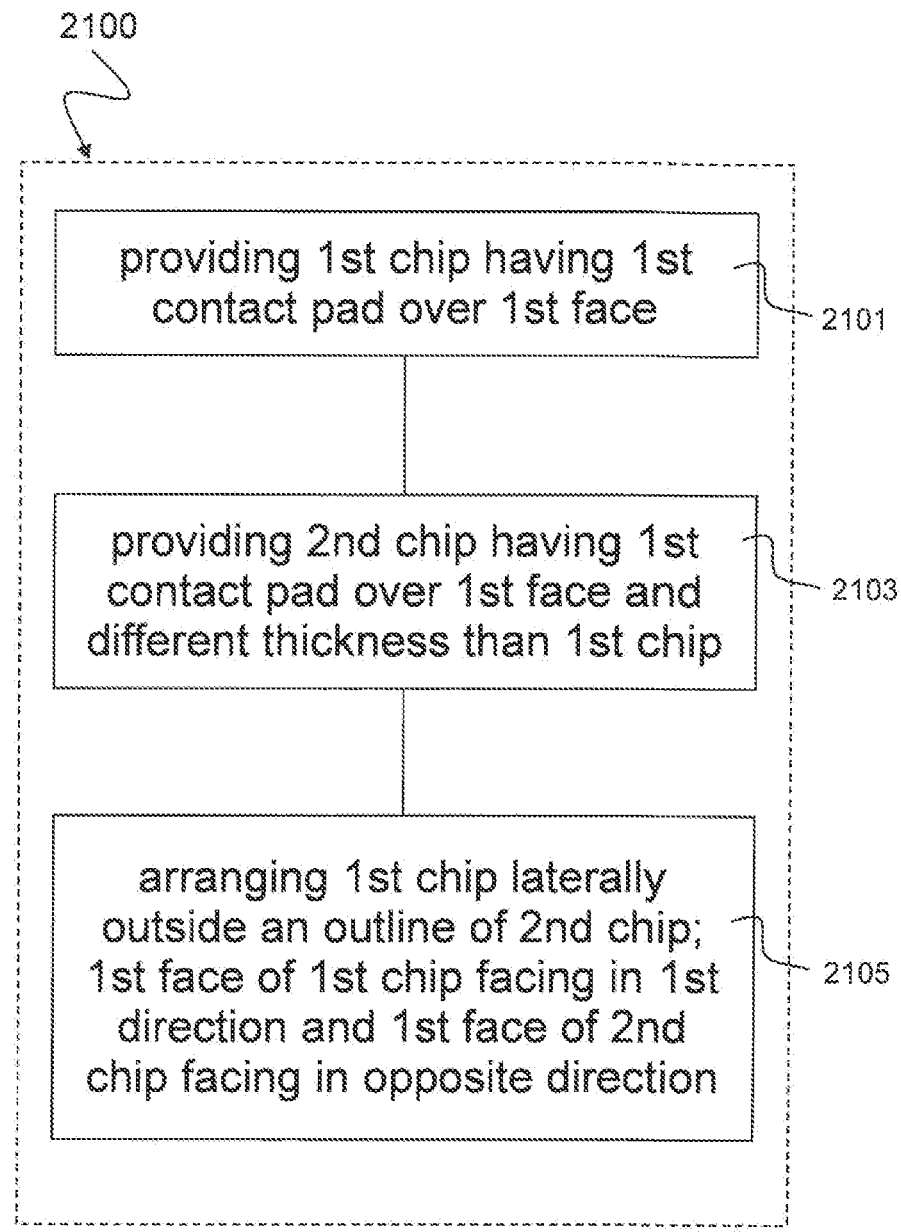
FIG. 21 illustrates a schematic diagram of a method 2100 for providing a device including a first semiconductor chip and a second semiconductor chip of different thickness.

FIG. 21 illustrates a schematic diagram of a method 2100 providing a package including a first semiconductor chip, for example the semiconductor chip IC1 depicted in FIG. 20 and a second semiconductor chip, for example the semiconductor chip IC3 depicted in FIG. 20, where both semiconductor chips are having different thicknesses.

The method 2100 may include an act 2101 of providing a first semiconductor chip having a first thickness and including a first face, wherein a first contact pad is arranged over the first face. The method 2100 may further include an act 2103 of providing a second semiconductor chip having a second thickness different from the first thickness and including a first face, wherein a first contact pad is arranged over the first face. The method 2100 may further include an act 2105 of arranging the first semiconductor chip and the second semiconductor chip such that the first face of the first semiconductor chip faces in a first direction and the first face of the second semiconductor chip faces in a second direction opposite to the first direction and the first semiconductor chip is located laterally outside of an outline of the second semiconductor chip.

In one example, the method 2100 may include an act of arranging the first semiconductor chip and the second semiconductor chip such that the first face of the first semiconductor chip and a second face of the second semiconductor chip opposite to the first face of the second semiconductor chip are arranged on different heights.

In one example, the method 2100 may include an act of embedding the first semiconductor chip in a material layer, e.g. a material layer 2070 as described above with respect to FIG. 20. In one example, the material layer may include at least one of a laminate, an epoxy, a filled epoxy, glass fiber filled epoxy an imide, a thermoplastic or duroplastic polymer or polymer blend. In one example, the method 2100 may include an act of providing an opening in the material layer, wherein the opening may be arranged laterally outside of an outline of the first semiconductor chip, and a further act of arranging the second semiconductor chip in the opening of the material layer. In one example, the method 2100 may include an act of providing at least one electrically insulating layer, an act of forming an opening in the at least one electrically insulating layer, an act of arranging the at least one electrically insulating layer over the material layer such that the opening of the at least one electrically insulating layer is aligned with the opening of the material layer, and an act of arranging the second semiconductor chip in the opening of the material layer and in the opening of the at least one electrically insulating layer. In one example, the method 2100 may include that a thickness of the at least one electrically insulating layer may be similar to a height difference between a layup of the first semiconductor chip embedded in the material layer and the second semiconductor chip. In one example, the method 2100 may include that a thickness of the at least one electrically insulating layer may compensate a height difference between a layup of the first semiconductor chip embedded in the material layer and the second semiconductor chip.

In one example, the method 2100 may include one or more of the process steps as described with respect to FIGS. 1 to 19.

Figure 22:
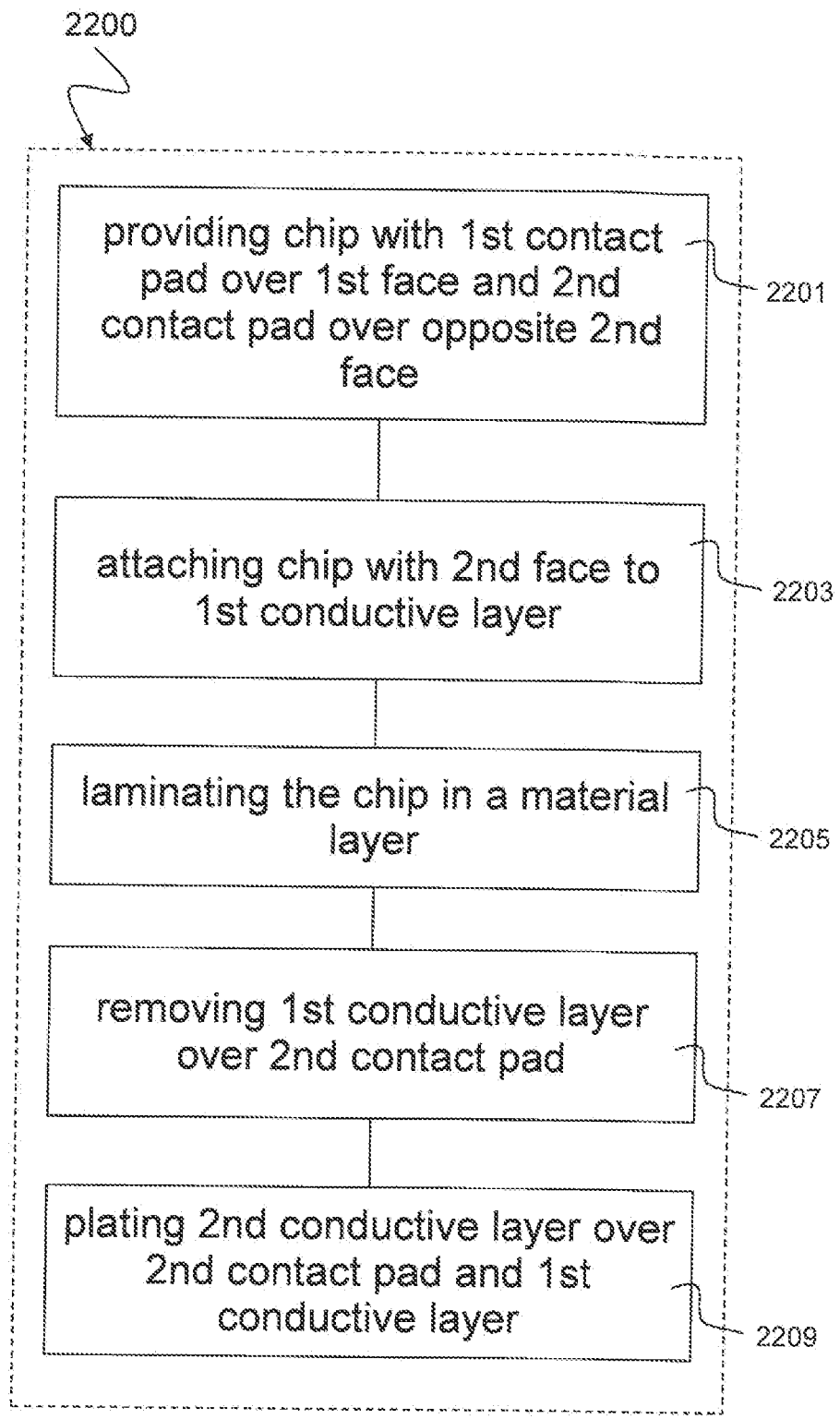
FIG. 22 illustrates a schematic diagram of a method 2200 for providing a device including a semiconductor chip with a plated contact pad.

FIG. 22 illustrates a schematic diagram of a method 2200 providing a package, e.g. a core layer package as described above with respect to FIGS. 1 to 9, including a semiconductor chip, e.g. a semiconductor chip IC1 as depicted in FIG. 20 or in FIGS. 1 to 9 with a plated contact pad. The method 2200 may include an act 2201 of providing a semiconductor chip including a first face and a second face opposite the first face, wherein a first contact pad, e.g. a source or a gate contact pad, may be arranged over the first face and a second contact pad, e.g. a drain contact pad, may be arranged over the second face. The method 2200 may further include an act 2203 of attaching the semiconductor chip to a first electrically conductive layer such that the second face of the semiconductor chip may face the first electrically conductive layer. The method 2200 may further include an act 2205 of laminating the semiconductor chip in a material layer. The method 2200 may further include an act 2207 of removing the first electrically conductive layer over at least a part of the second contact pad of the semiconductor chip such that an opening may be formed over the second contact pad. The method 2201 may include an act 2209 of plating a second electrically conductive layer over the second contact pad and the first electrically conductive layer such that the second electrically conductive layer may electrically couple the second contact pad with the first electrically conductive layer.

In one example, the method 2200 may include that the first electrically conductive layer includes a copper foil, and that the second electrically conductive layer includes a metal layer. In one example, the method 2200 may include that plating the second electrically conductive layer is performed such that the plated second electrically conductive layer may preserve a contour of the opening. In one example, the method 2200 may include forming an opening in an electrically insulating layer, arranging the electrically insulating layer between the first electrically conductive layer and a third electrically conductive layer such that the first face of the semiconductor chip may face the third electrically conductive layer and the opening in the electrically insulating layer may be aligned to an outline of the semiconductor chip, and laminating the electrically insulating layer with the first electrically conductive layer and the third electrically conductive layer such that a layer embedding the semiconductor chip may be formed.

In one example, the plating the second electrically conductive layer over the second contact pad may be such that the second contact pad may be very close to the second electrically conductive layer. This may be achieved by using a thin first electrically conductive layer. In one example, the method 2200 may include that a thickness of the first electrically conductive layer lies in a range between about 1 µm (micrometer) and about 18 µm (micrometer) or in a range between about 18 µm (micrometer) and about 105 µm (micrometer). In one example, the method 2200 may include that a thickness of the first electrically conductive layer lies in a range between about 3 µm (micrometer) and about 12 µm (micrometer). The first electrically conductive layer may be a copper foil 103, for example as described with respect to FIGS. 1 to 9. In one example, the method 2200 may include one or more process steps as described with respect to FIGS. 1 to 9.

By using the process as described with respect to FIGS. 1 to 19, dies that have different die thickness may be embedded in the same package. The process disclosed herein may be accurate enough and capable for volume production.

By using the process as described above with respect to FIGS. 1 to 19 the surface of the dies does not necessarily have to be within few micrometer on a same height from the leadframe surface and there may be no limitations on the thickness of the dies with respect to the microvia sizes. The thick dies do not necessarily have to be embedded inside an accurately manufactured cavity on a leadframe. Instead, thick dies may be embedded in the package without influencing manufacture of the leadframe. Therefore, manufacturing cavities that may have accurately defined depth and good surface quality for diffusion soldering can be avoided. This may reduce design complexity and may guarantee low cost volume production. By using the process as described above, approaches like "half etching" and "mechanical/electrical discharge machining" may be avoided.

The process disclosed herein allows embedding two different die thicknesses inside the laminate. At a first phase as described above with respect to FIGS. 1 to 9, thin dies may be embedded inside the core layer and electrically connected from the top and bottom side of the components to the conductors, e.g. Cu conductors. At a second phase described above with respect to FIGS. 10 to 19, thick dies may afterwards be embedded through the core layer using a similar process that is used to embed the thin dies and may be connected to the conductor layer on the buildup layer.

In addition, while a particular feature or aspect of an example of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that examples of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific examples have been illustrated and described herein, it will be appreciated by those of ordinary skill in the art that a variety of alternate and/or equivalent implementations may be substituted for the specific examples shown and described without departing from the concept of the present disclosure. This application is intended to cover any adaptations or variations of the specific examples discussed herein.

What is claimed is:

1. A method of making a semiconductor device comprising:
   providing a first semiconductor chip comprising a first face and a second face;
   arranging a first semiconductor chip first contact pad over the first face of the first semiconductor chip, and arranging a first semiconductor chip second contact pad over the second face of the first semiconductor chip opposite to the first face of the first semiconductor chip;
   providing a second semiconductor chip comprising a first face;
   arranging a second semiconductor chip first contact pad over the first face of the second semiconductor chip;
   arranging the first semiconductor chip and the second semiconductor chip such that the first face of the first semiconductor chip faces in a first direction and the first face of the second semiconductor chip faces in a second direction opposite to the first direction;
   arranging the first face of the first semiconductor chip and a second face of the second semiconductor chip, opposite to the first face of the second semiconductor chip, on different heights relative to a major surface of the device; and
   locating the first semiconductor chip laterally outside of an outline of the second semiconductor chip.

2. The method of claim 1, comprising defining at least one of the first semiconductor chip and the second semiconductor chip as a power semiconductor.

3. The method of claim 1, further comprising:
at least partially embedding the first semiconductor chip and the second semiconductor chip in a material layer.

4. The method of claim 3, defining the material layer to comprise at least one of a laminate, an epoxy, a filled epoxy, glass fiber filled epoxy, an imide, a thermoplast and a duroplast polymer or polymer blends.

5. The method of claim 1, comprising providing a third semiconductor chip.

6. The method of claim 1, comprising:
arranging the third semiconductor chip laterally outside of an outline of the first semiconductor chip and laterally outside of an outline of the second semiconductor chip.

7. The method of claim 6, comprising:
arranging a third semiconductor chip first contact pad over a first face of the third semiconductor chip; and
arranging a third semiconductor chip second contact pad over the first face of the third semiconductor chip.

8. The method of claim 7, comprising:
arranging a third semiconductor chip third contact pad over a second face of the third semiconductor chip opposite to the first face of the third semiconductor chip.

9. The method of claim 7, comprising:
positioning the first face of the third semiconductor chip on a first height and positioning the first face of the second semiconductor chip on a second height different from the first height.

10. A method of making a semiconductor device comprising:
providing a first semiconductor chip comprising a first face, wherein a first semiconductor chip first contact pad is arranged over the first face of the first semiconductor chip;
providing a second semiconductor chip comprising a first face, wherein a second semiconductor chip first contact pad is arranged over the first face of the second semiconductor chip;
locating the first semiconductor chip laterally outside of an outline of the second semiconductor chip;
defining a thickness of the first semiconductor chip to be different from a thickness of the second semiconductor chip;
arranging a first semiconductor chip second contact pad over a second face of the first semiconductor chip opposite to the first face of the first semiconductor chip;
arranging the first face of the first semiconductor chip and a second face of the second semiconductor chip, opposite to the first face of the second semiconductor chip, on different heights relative to a major surface of the device; and
arranging the second face of the first semiconductor chip and the first face of the second semiconductor chip on different heights relative to the major surface of the device.

11. The method of claim 10, further comprising:
providing a material layer, including embedding the first semiconductor chip, the second semiconductor chip at least partly in the material layer.

12. The method of claim 11, comprising:
defining the material layer to comprises at least one of a laminate, an epoxy, a filled epoxy, glass fiber filled epoxy, an imide, a thermoplast and a duroplast polymer or polymer blends.

13. The method of claim 10, comprising;
providing a third semiconductor chip; and
defining a thickness of the third semiconductor chip to be different than a thickness of the second semiconductor chip.

14. The method of claim 13, comprising locating the third semiconductor chip laterally outside of an outline of the first semiconductor chip and laterally outside of an outline of the second semiconductor chip.

15. The method of claim 13, comprising providing a material layer, including at least partially embedding the first semiconductor chip, the second semiconductor chip and the third semiconductor chip in the material layer.

16. A method of making a semiconductor device comprising:
providing a first semiconductor chip manufactured from a semiconductor material and comprising a first face and a second face, the second face on an opposite side of the first semiconductor chip than the first face of the first semiconductor chip, wherein a first semiconductor chip first contact pad is arranged over the first face of the first semiconductor chip, and wherein a first semiconductor chip second contact pad is arranged over the second face of the first semiconductor chip;
providing a second semiconductor chip manufactured from a semiconductor material and comprising a first face, including arranging a second semiconductor chip first contact pad over the first face of the second semiconductor chip;
defining a thickness of the first semiconductor chip that is different from a thickness of the second semiconductor chip;
arranging a conductive layer over the first face of the first semiconductor chip, including arranging the conductive layer over the second face of the second semiconductor chip;
coupling the conductive layer to the first semiconductor chip to the second semiconductor chip; and
locating the first semiconductor chip laterally outside of an outline of the second semiconductor chip.

17. The method of claim 16, comprising defining the conductive layer as a patterned electrically conductive layer arranged over a second face of the first semiconductor chip opposite to the first face of the first semiconductor chip and electrically coupled to the first semiconductor chip second contact pad by one of a plated connection and a microvia array or through one or multiple openings over the second contact pad,
wherein the patterned electrically conductive layer is arranged over the first face of the second semiconductor chip and electrically coupled to the second semiconductor chip first contact pad by a via connection and wherein the first and second semiconductor chips are each integrated circuit semiconductor chips.

18. The method of claim 17, comprising providing a second patterned electrically conductive layer couple to the first semiconductor chip and the second semiconductor chip.

19. The method of claim 18, comprising arranging the second patterned electrically conductive layer over the first face of the first semiconductor chip and over the second face of the second semiconductor chip.

20. The method of claim 18, comprising vias attaching the electrically conductive layer to the second electrically conductive layer.

21. The method of claim 16, comprising attaching conductive bumps on the electrically conductive layer providing external contacts for connection to an external device.

22. The method of claim 16, comprising arranging the first face of the first semiconductor chip and a second face of the second semiconductor chip, opposite to the first face of the second semiconductor chip, on different heights relative to a major surface of the device.

* * * * *